(12) United States Patent
Kim

(10) Patent No.: US 9,252,754 B2
(45) Date of Patent: Feb. 2, 2016

(54) SCAN FLIP-FLOP, METHOD THEREOF AND DEVICES HAVING THE SAME

(71) Applicant: Min Su Kim, Hwaseong-si (KR)

(72) Inventor: Min Su Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 13/624,492

(22) Filed: Sep. 21, 2012

(65) Prior Publication Data

US 2013/0241617 A1    Sep. 19, 2013

(30) Foreign Application Priority Data

Mar. 16, 2012    (KR) .......................... 10-2012-0027387

(51) Int. Cl.
*H03K 3/00* (2006.01)
*H03K 3/356* (2006.01)
*G01R 31/3185* (2006.01)

(52) U.S. Cl.
CPC .. *H03K 3/356139* (2013.01); *G01R 31/318541* (2013.01)

(58) Field of Classification Search
CPC ................. H03K 3/012; H03K 3/037; H03K 3/356156–3/356173; G01R 31/318541
See application file for complete search history.

(56) References Cited

U.S. PATENT DOCUMENTS

| 7,154,319 | B2 | 12/2006 | Kim |
| 7,202,724 | B2 | 4/2007 | Kim |
| 7,724,605 | B2 | 5/2010 | Kong et al. |
| 7,843,243 | B2 | 11/2010 | Kim |
| 7,915,925 | B2 * | 3/2011 | Cong .............................. 326/95 |
| 8,132,039 | B1 * | 3/2012 | Nguyen ........................ 713/501 |
| 2002/0075053 | A1 | 6/2002 | Ganesan |
| 2007/0001734 | A1 | 1/2007 | Onouchi et al. |
| 2007/0250284 | A1 * | 10/2007 | Takeoka et al. ............... 702/117 |
| 2010/0073028 | A1 | 3/2010 | Kim |

FOREIGN PATENT DOCUMENTS

| KR | 10-2002-0074848 A | 10/2002 |
| KR | 10-2009-0046157 A | 5/2009 |
| KR | 10-2009-0059580 A | 6/2009 |

OTHER PUBLICATIONS

Communication issued Jun. 10, 2014, by the Australian Patent Office in corresponding Application No. 2013201156.

* cited by examiner

*Primary Examiner* — Sibin Chen
(74) *Attorney, Agent, or Firm* — Sughrue Mion, PLLC

(57) ABSTRACT

A scan flip-flop, which performs a normal operation latching a data input and a scan operation latching a scan input, includes a first circuit, a second circuit and a latch. The first circuit determines a voltage of an intermediate node based on a clock signal, one of the data input and the scan input, and data of a latch input node. The second circuit determines the data based on the clock signal, the voltage of the intermediate node and the data input during the normal operation, and determines the data based on the clock signal and the voltage of the intermediate node during the scan operation. The latch latches the data based on the clock signal.

28 Claims, 40 Drawing Sheets

SCAN OPERATION

SCAN FLIP-FLOP, METHOD THEREOF AND DEVICES HAVING THE SAME

CROSS-REFERENCE TO RELATED APPLICATION

This application claims priority under 35 U.S.C. §119(a) from Korean Patent Application No. 10-2012-0027387 filed on Mar. 16, 2012, the disclosure of which is hereby incorporated by reference in its entirety.

BACKGROUND

1. Field

Apparatuses and methods consistent with exemplary embodiments of the inventive concept relate to a scan flip-flop, and more particularly, to a high-speed low-power scan flip-flop, an operating method thereof and data processing devices having the same.

2. Description of the Related Art

To design a high speed operation chip, designing a high speed flip-flop may be required. A related-art master-slave flip-flop is widely used due to its small size and low power consumption. However, using the master-slave flip-flop in the high-speed operating chip reaches a limit due to data-to-output latency. To improve the limit of the master-slave flip-flop, a pulse flip-flop or a semi-dynamic flip-flop is developed. However, a yield of a chip using the pulse flip-flop or the semi-dynamic flip-flop is not good because of unstable characteristics of a pulse, and it is not easy to integrate the pulse-flip-flop or the semi-dynamic flip-flop on the chip because of a long hold time.

SUMMARY

One or more exemplary embodiments provide an operating method of a scan flip-flop which performs a normal operation latching a data input and a scan operation latching a scan input, the method including, when the scan flip-flop performs the scan operation, determining an intermediate node voltage, which is a voltage at an intermediate node of the scan flip-flop, based on a clock signal, the scan input and data of a latch input node, determining the data based on the clock signal and the intermediate node voltage, and latching the data based on the clock signal.

The determining the intermediate node voltage may include: keeping an intermediate node voltage at a first phase of the clock signal to an intermediate node voltage when the clock signal transits; and determining an intermediate node voltage at a second phase of the clock signal to be synchronized with the scan input. The first phase and the second phase have opposite signal levels.

An overlap section of the clock signal and the intermediate node voltage may correspond to a half-cycle of the clock signal.

The determining data may include: sourcing a supply voltage to the latch input node based on the clock signal and the intermediate node voltage; and sinking a voltage of the latch input node to a ground based on the clock signal, the intermediate node voltage and the data input during the normal operation, and sinking the voltage of the latch input node to the ground based on the clock signal and the intermediate node voltage during the scan operation.

One or more exemplary embodiment provide a scan flip-flop which performs a normal operation latching a data input and a scan operation latching a scan input, including a first circuit, a second circuit and a latch.

The first circuit may determine an intermediate node voltage based on a clock signal, one of the data input and the scan input, and data of a latch input node.

The second circuit may determine the data based on the clock signal, the intermediate node voltage and the data input during the normal operation, and determines the data based on the clock signal and the intermediate node voltage during the scan operation. The latch may latch the data based on the clock signal.

When the scan flip-flop performs the scan operation, the first circuit may keep an intermediate node voltage at a first phase of the clock signal to an intermediate node voltage when the clock signal transits, determines an intermediate node voltage at a second phase of the clock signal to be synchronized with the scan input. The first phase and the second phase may have opposite signal levels. The second circuit may include a sourcing circuit and a sinking circuit.

The sourcing circuit may source a supply voltage to the latch input node based on the clock signal and the intermediate node voltage. The sinking circuit may sink a voltage of the latch input node to a ground based on the clock signal, the intermediate node voltage and the data input during the normal operation, and sink the voltage of the latch input node to the ground based on the clock signal and the intermediate node voltage during the scan operation.

According to an aspect of an exemplary embodiment, the first circuit may include a sourcing circuit which includes a first sub-sourcing circuit controlling a connection between a power node and the intermediate node in response to the clock signal and the scan input, and a second sub-sourcing circuit controlling the connection between the power node and the intermediate node in response to the data.

According to an aspect of another exemplary embodiment, the first circuit may include a first connection circuit controlling a connection between the intermediate node and a ground node based on the scan input and the data, and a second connection circuit controlling the connection between the intermediate node and the ground node based on a logical combination signal of a scan enable signal and the data input, the data, and the clock signal.

According to an aspect of still another exemplary embodiment, the first circuit may include a first connection circuit controlling a connection between the intermediate node and a ground node in response to the scan input and the data, and a second connection circuit controlling the connection between the first connection circuit and the ground node in response to a logical combination signal of a scan enable signal and the data input, and the clock signal.

According to an aspect of still another exemplary embodiment, the first circuit may include a first connection circuit controlling a connection between the intermediate node and a ground node in response to the scan input and the data, and a second connection circuit controlling connection between the intermediate node and the first connection circuit in response to a logical combination signal of a scan enable signal and the data input, and the clock signal.

The scan flip-flop may further include a logic circuit, which generates the scan input by performing a logical operation on a scan enable signal indicating the normal operation and the scan operation and scan data. The data input may be a parallel data including one-bit or more.

According to an aspect of still another exemplary embodiment, the first circuit may include a first keeper circuit for discharging the data based on the clock signal and the data, and a second keeper circuit for discharging the intermediate node voltage based on the clock signal and the intermediate node voltage.

According to an aspect of still another exemplary embodiment, the first circuit may include a keeper circuit for discharging the data through the second circuit based on the clock signal, the data and the intermediate node voltage.

One or more exemplary embodiments provide another scan flip-flop performing a normal operation latching a data input and a scan operation latching a scan input, including a first circuit, a second circuit, a latch and a reset circuit.

The first circuit may determine an intermediate node voltage based on a clock signal, one of the data input and the scan input, and data of a latch input node. The second circuit may determine the data based on the clock signal, the intermediate node voltage and the data input during the normal operation, and determines the data based on the clock signal and the intermediate node voltage during the scan operation. The latch may latch the data based on the clock signal.

The reset circuit may pull down the intermediate node voltage to a ground in response to an indication signal indicating a reset operation.

According to an exemplary embodiment, there is provided a data processing device which may include a data source outputting at least one of a scan data and a data input, and a scan flip-flop which may perform a scan operation latching a scan input related to the scan data and a normal operation latching the data input.

BRIEF DESCRIPTION OF THE DRAWINGS

FIGS. 26B to 28 are circuit diagrams depicting exemplary embodiments of the scan flip-flop illustrated in FIG. 26A;

DETAILED DESCRIPTION OF THE EXEMPLARY EMBODIMENTS

A scan input of the inventive concepts means a signal generated according to a logical combination of a scan data SIN and a scan enable signal SE, or the scan data SIN itself.

Figure 1:
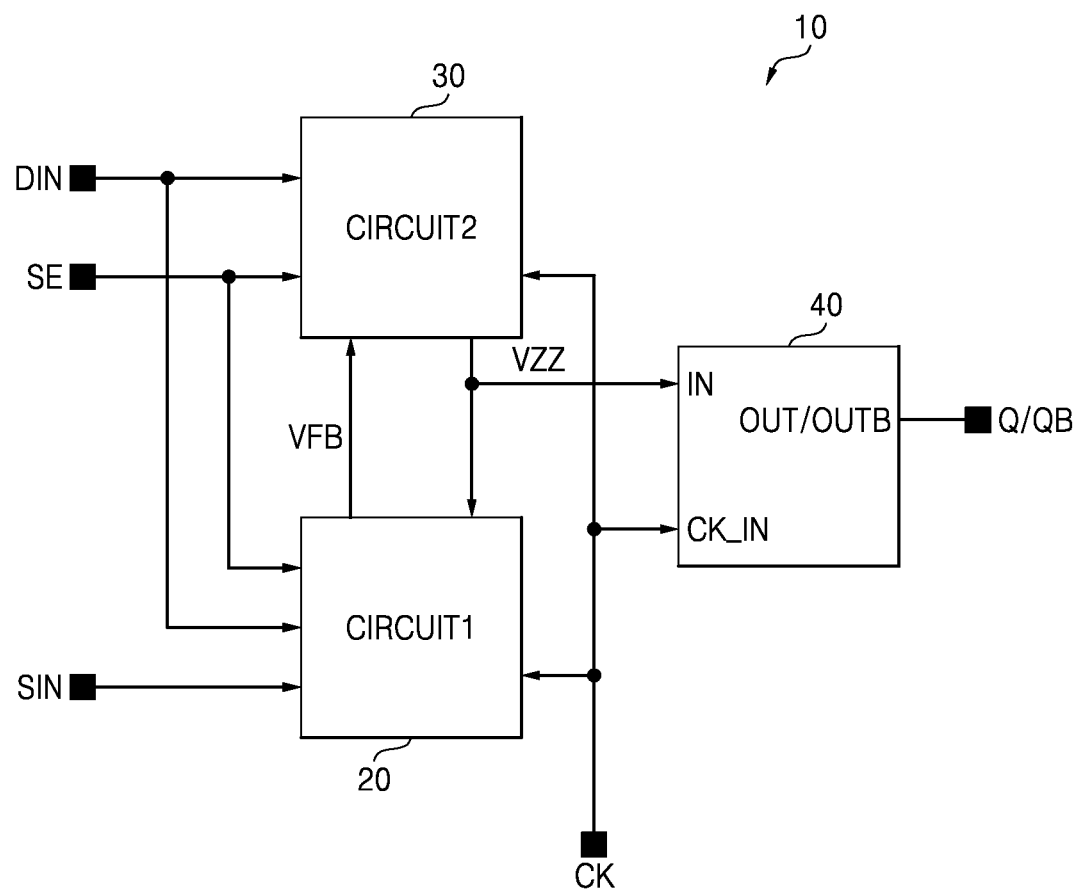
FIG. 1 is a schematic block diagram of a scan flip-flop according to an exemplary embodiment.

FIG. 1 is a schematic block diagram of a scan flip-flop according to an example embodiment. Referring to FIG. 1, a scan flip-flop 10 may include a first circuit 20, a second circuit 30, and a latch 40.

The scan flip-flop 10 may perform selectively a normal operation, e.g., latching a data input DIN, and a scan operation, e.g., latching a scan data SIN, based on a level of a scan enable signal SE. According to an exemplary embodiment, the data input DIN may be a parallel data including one-bit or more. For example, when the level of the scan enable signal SE is a first level, e.g., a low level or a logic 0, the scan flip-flop 10 may perform a normal operation. In addition, when the level of the scan enable signal SE is a second level, e.g., a high level or a logic 1, the scan flip-flop 10 may perform a scan operation.

Hereinafter, for convenience of explanation, the first level is referred to as "L-level" and the second level is referred to as "H-level".

The first circuit 20 may determine an intermediate node voltage (or a voltage level VFB) of an intermediate node based on a clock signal CK, one of a scan data SIN and a data input DIN, and data VZZ of a latch input node.

The second circuit 30 may determine the data VZZ of the latch input node based on the clock signal CK, the intermediate node voltage VFB of the intermediate node and the data input DIN during a normal operation. In addition, the second circuit 30 may determine the data VZZ of the latch input node based on the clock signal CK and the intermediate node voltage VFB of the intermediate node during a scan operation.

The latch 40 may latch the data VZZ of the latch input node based on the clock signal CK, e.g., a rising edge. For example, the latch 40 includes an input terminal IN receiving the data VZZ output from the latch input node, a control terminal CK_IN receiving the clock signal CK, and an output terminal OUT outputting an output data Q. According to an exemplary embodiment, the latch 40 may output the output data Q through the output terminal OUT and output an inverted output data QB through an inverted output terminal OUTB.

Here, the data VZZ may mean L-level or H-level determined based on a voltage level of the latch input node.

Figure 2:
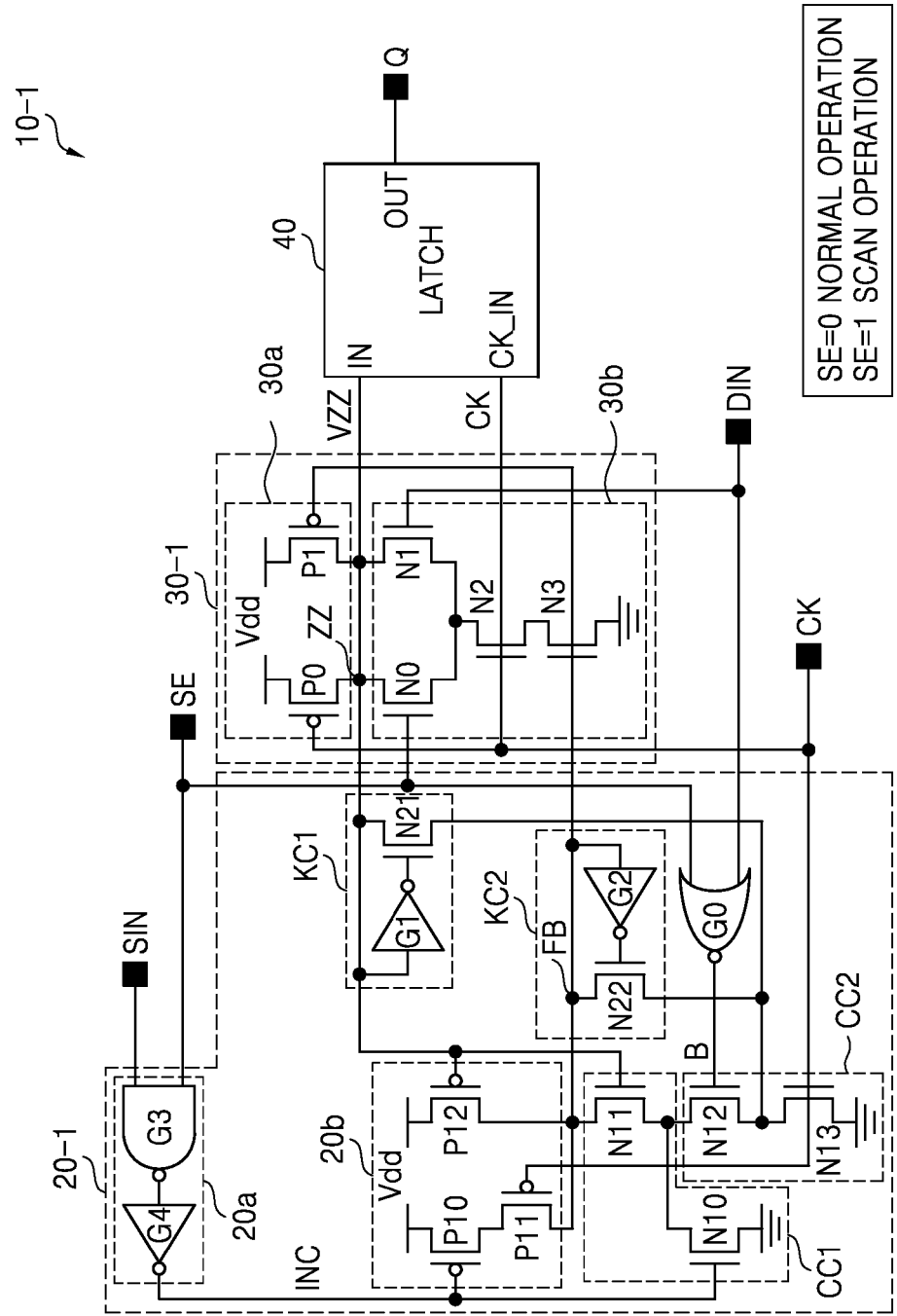
FIG. 2 is a circuit diagram depicting an exemplary embodiment of the scan flip-flop illustrated in FIG. 1 according to an exemplary embodiment.

FIG. 2 is a circuit diagram depicting an exemplary embodiment of the scan flip-flop illustrated in FIG. 1.

A scan flip-flop 10-1 according to an exemplary embodiment of the scan flip-flop 10 of FIG. 1 includes a first circuit 20-1, a second circuit 30-1 and the latch 40.

Each circuit 20-1, 30-1 and 40 may be modified or changed variously as illustrated in FIGS. 7 to 33.

The first circuit 20-1 includes a first logic circuit 20a, a first sourcing circuit 20b, a first connection circuit CC1, a second connection circuit CC2, a first keeper circuit KC1, a second keeper circuit KC2 and a second logic circuit G0.

The first logic circuit 20a generates a scan input INC by performing a logical combination on a scan data SIN and a scan enable signal SE.

For convenience of explanation, FIG. 2 illustrates the first logic circuit 20a including a NAND gate G3 and an inverter G4; however, a structure of the first logic circuit 20a may be changed variously according to exemplary embodiments.

The first logic circuit 20a may mask the scan data SIN according to a level of the scan enable signal SE. For example, when the scan enable signal SE is at L-level, i.e., during a normal operation, the first logic circuit 20a may block transmission of the scan data SIN. Here, an output signal INC of the first logic circuit 20a, e.g., a scan input, may be at L-level.

When the scan enable signal SE is at H-level, i.e., during a scan operation, the first logic circuit 20a may transmit the scan data SIN to the first circuit 20-1 as the scan input INC. Accordingly, without considering a delay and element characteristics of the first logic circuit 20a, the scan data SIN and the scan input INC may be an identical signal during a scan operation.

Figure 3:
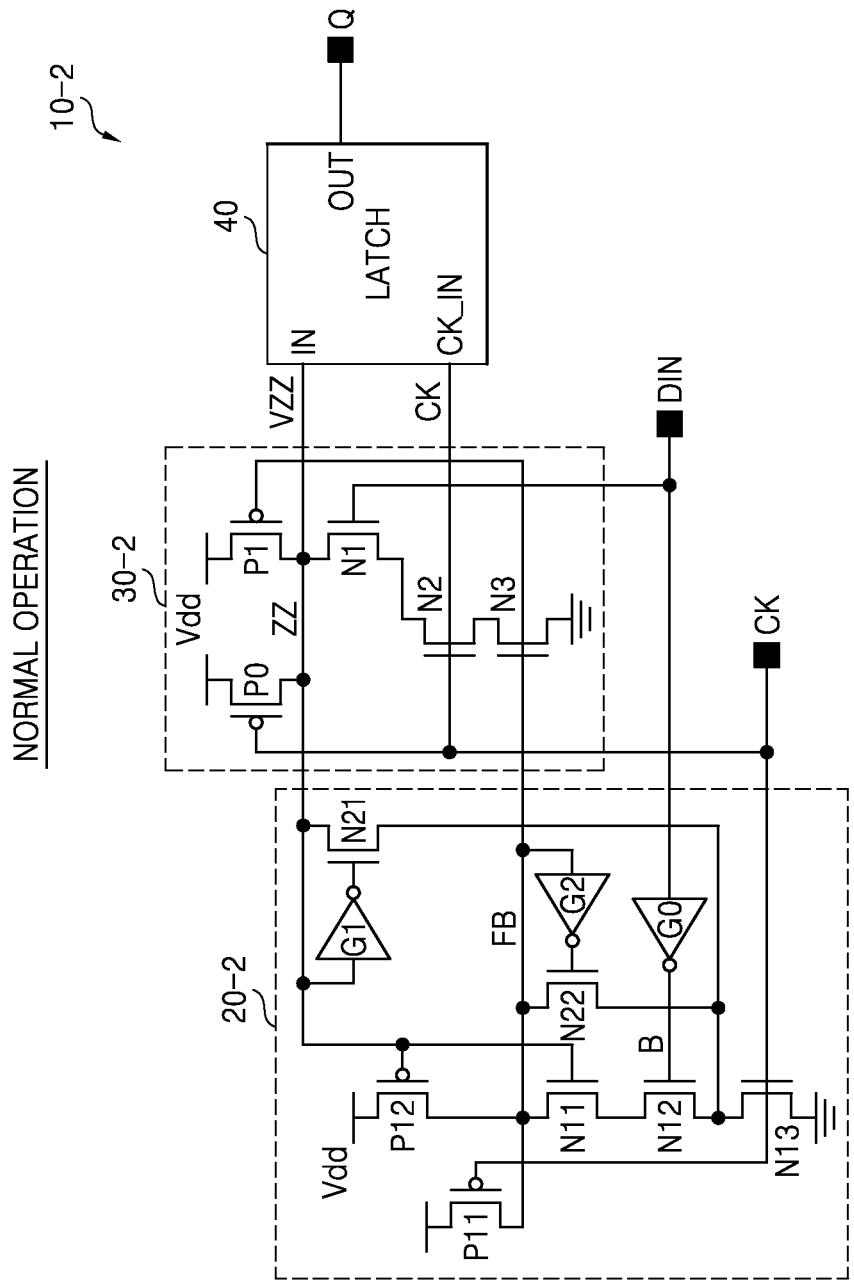
FIG. 3 depicts a connection relation of elements in a normal operation of the scan flip-flop illustrated in FIG. 2 according to an exemplary embodiment.

During a normal operation to be explained referring to FIG. 3, a first sourcing circuit 20b may source a supply voltage Vdd to the intermediate node FB according to the clock signal CK and data VZZ of a latch input node ZZ. In addition, during a scan operation to be explained referring to FIG. 5, the first sourcing circuit 20b may source the supply voltage Vdd to the intermediate node FB according to the clock signal CK, the data VZZ of the latch input node ZZ and the scan input INC.

The first sourcing circuit 20b includes a first sub sourcing circuit P10 and P11 and a second sub sourcing circuit P12. The first sub sourcing circuit P10 and P11 controls connection of a power node and the intermediate node FB according to a level of the scan input INC and a level of the clock signal CK. Here, the 'power node' means a node for supplying a supply voltage Vdd.

A second sub sourcing circuit P12 controls connection of the power node and the intermediate node FB according to the data VZZ of the latch input node ZZ. Each sub sourcing circuit may perform a function of a switching circuit or a pull-up circuit.

The first connection circuit CC1 may control connection between the intermediate FB and a ground (or a 'ground node' connected to the ground) according to the scan input INC and the data VZZ of the latch input node ZZ. The first connection circuit CC1 includes a transistor N10 gated based on the scan input INC and the transistor N11 gated based on the data VZZ of the latch input node ZZ.

The second connection circuit CC2 controls connection between the first connection circuit CC1 and the ground node based on an output signal B of the second logic circuit G0 and the clock signal CK. The second connection circuit CC2 includes a transistor N12 gated according to the output signal B of the second logic circuit G0 and a transistor N13 gated according to the clock signal CK.

As illustrated in FIGS. 11 to 19, connections and a structure of each connection circuit CC1 and CC2 may be changed variously.

The first keeper circuit KC1 may retain or maintain a voltage (or the data VZZ) of the latch input node ZZ which is discharged to the ground. For example, the first keeper circuit KC1 includes an inverter G1 and an NMOS transistor N21. When the clock signal CK is at H-level and the data VZZ of the latch input node ZZ is at L-level, the first keeper circuit KC1 may keep the data VZZ of the latch input node ZZ at L-level, e.g., the ground.

Figure 7:
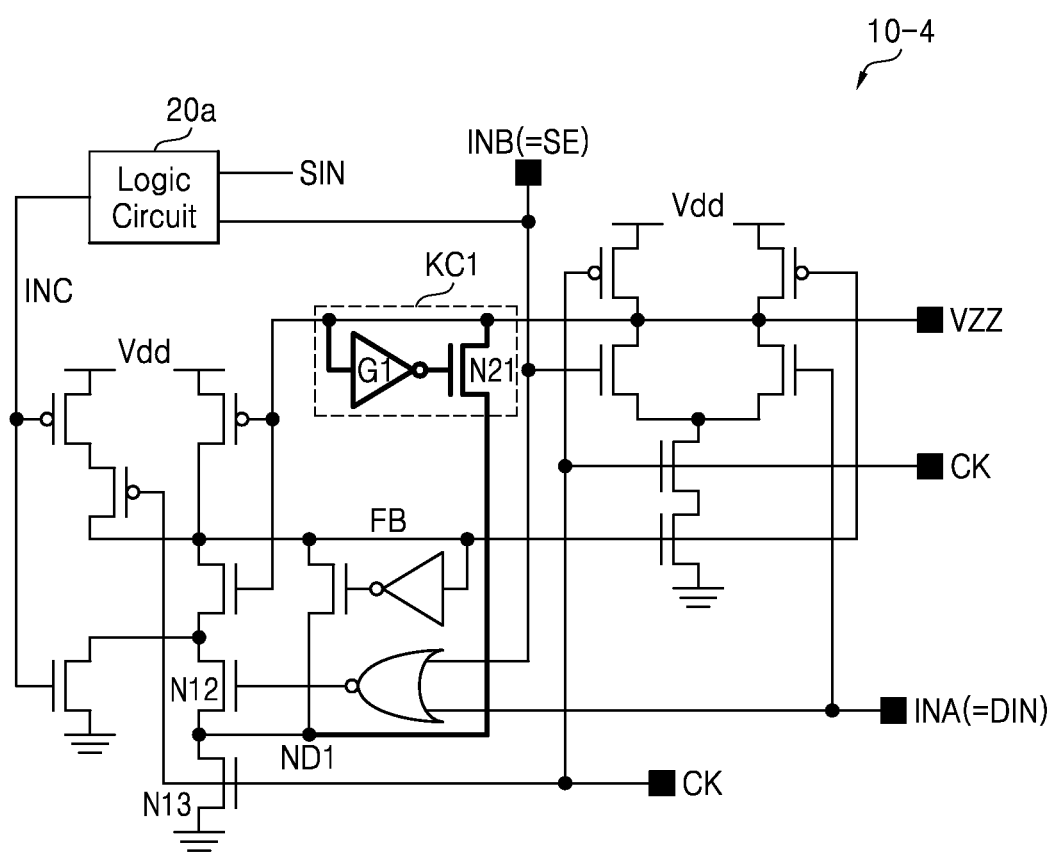
FIGS. 7 to 25 are circuit diagrams depicting other exemplary embodiments of the scan flip-flop illustrated in FIG. 1.
Figure 8:
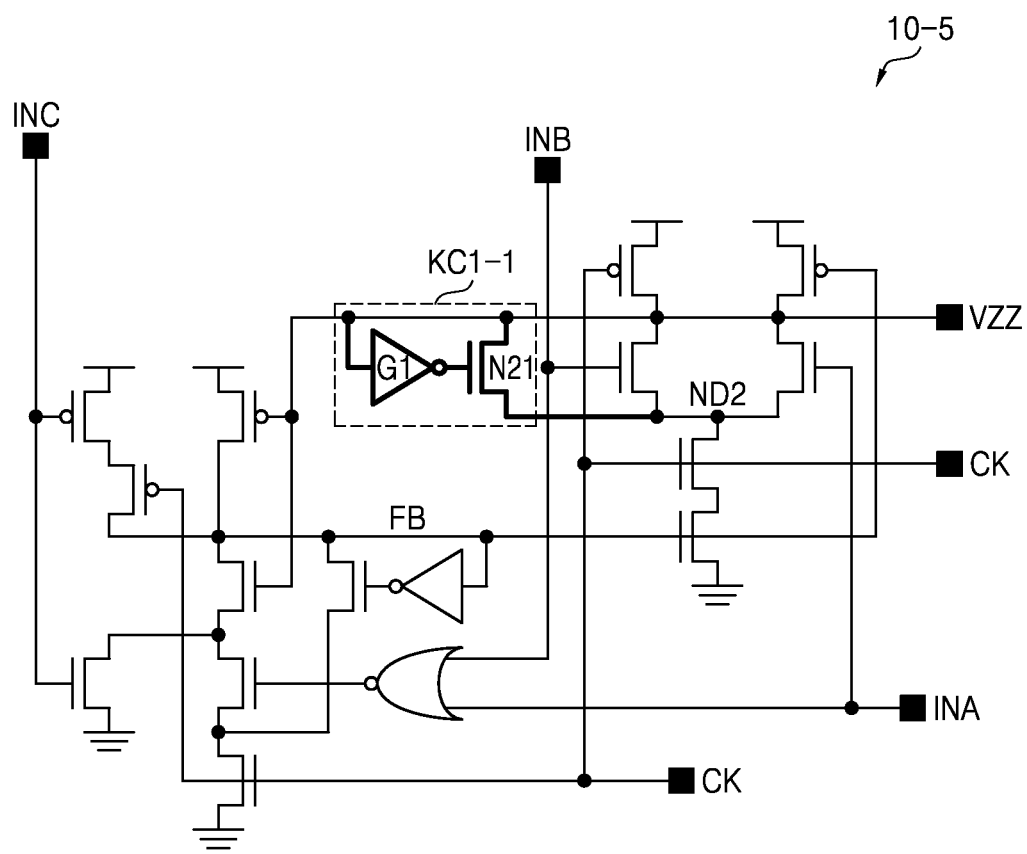
Figure 9:
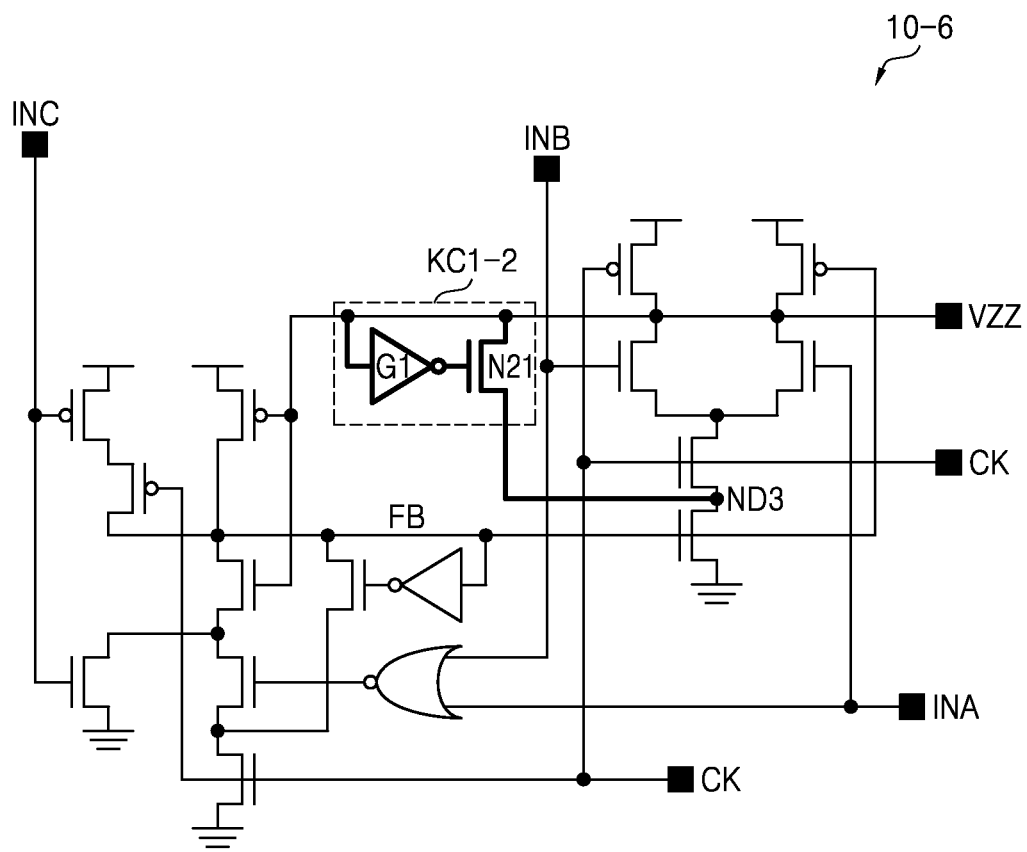

As illustrated in FIGS. 7 to 9, connections and a structure of the first keeper circuit KC1 may be changed variously.

The second keeper circuit KC2 may retain a voltage of an intermediate node FB which is discharged to the ground. For example, the second keeper circuit KC2 includes an inverter G2 and an NMOS transistor N22. When the clock signal CK is at H-level and the voltage of the intermediate node FB is at L-level, the second keeper circuit KC2 may keep the voltage of the intermediate node FB at L-level.

Figure 14:
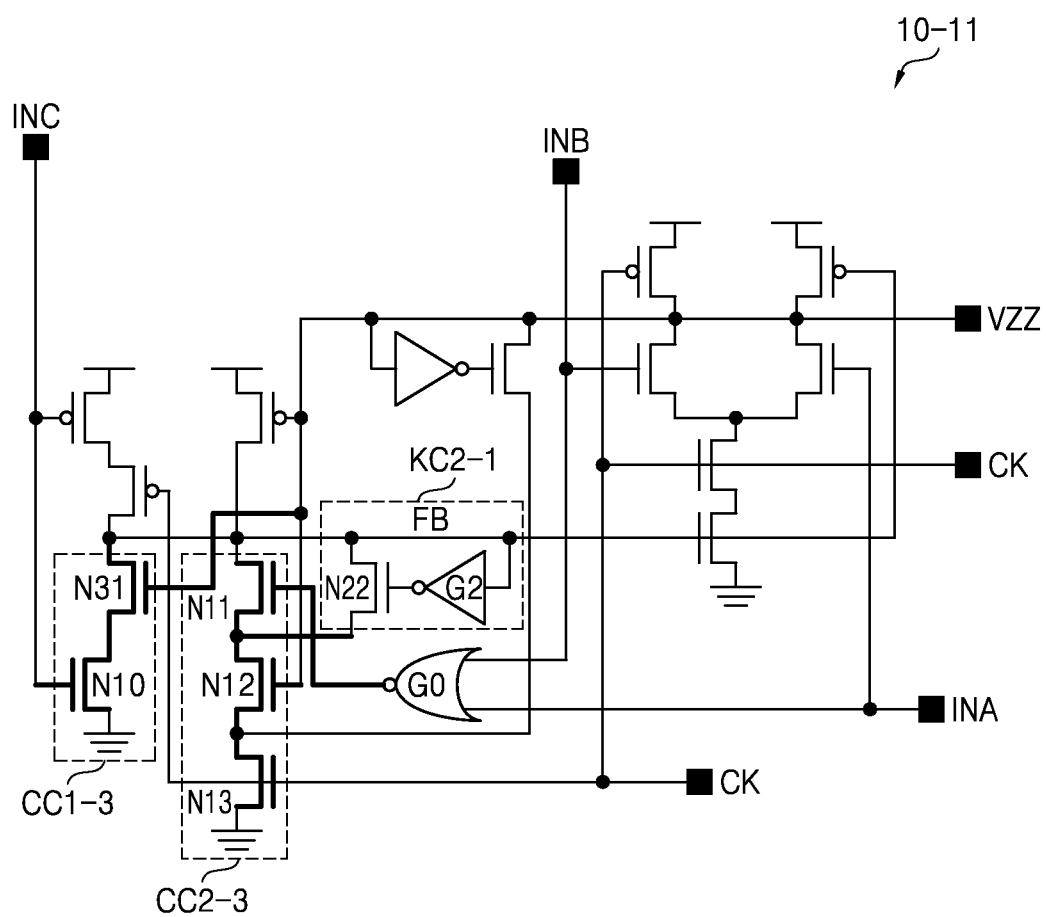
Figure 16:
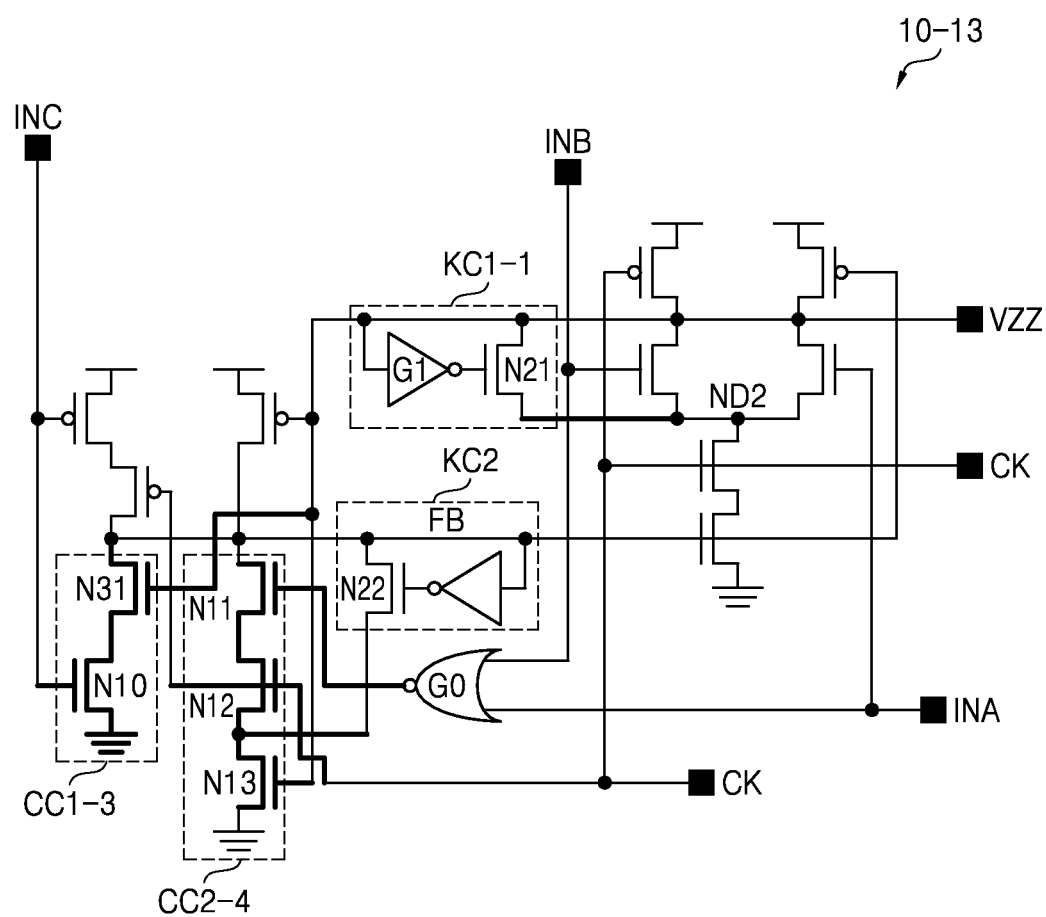

As illustrated in FIGS. 14 and 16, connections and a structure of the second keeper circuit KC2 may be changed variously.

A second logic circuit G0 performs a logical combination on the scan enable signal SE and the data input DIN, and generates an output signal B in accordance with a logical combination result. For example, the second logic circuit G0 may be embodied in a NOR gate.

Figure 29:
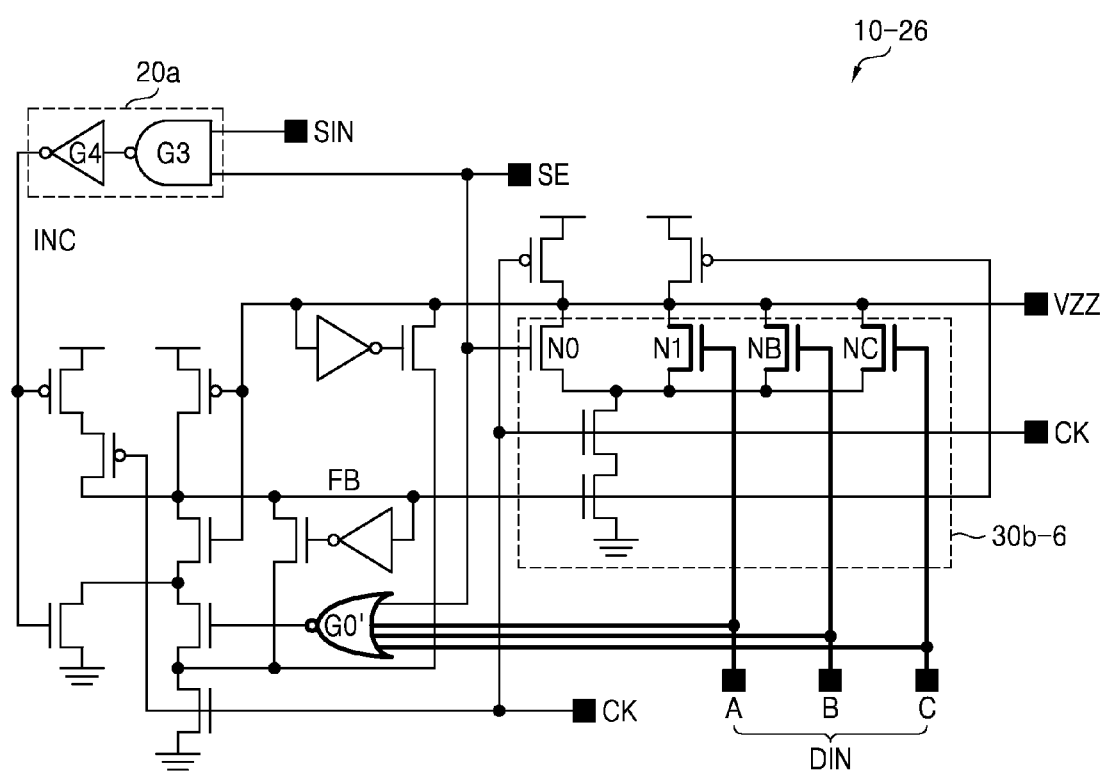
FIGS. 29 to 32 are circuit diagrams depicting still other exemplary embodiments of the scan flip-flop illustrated in FIG. 1.
Figure 30:
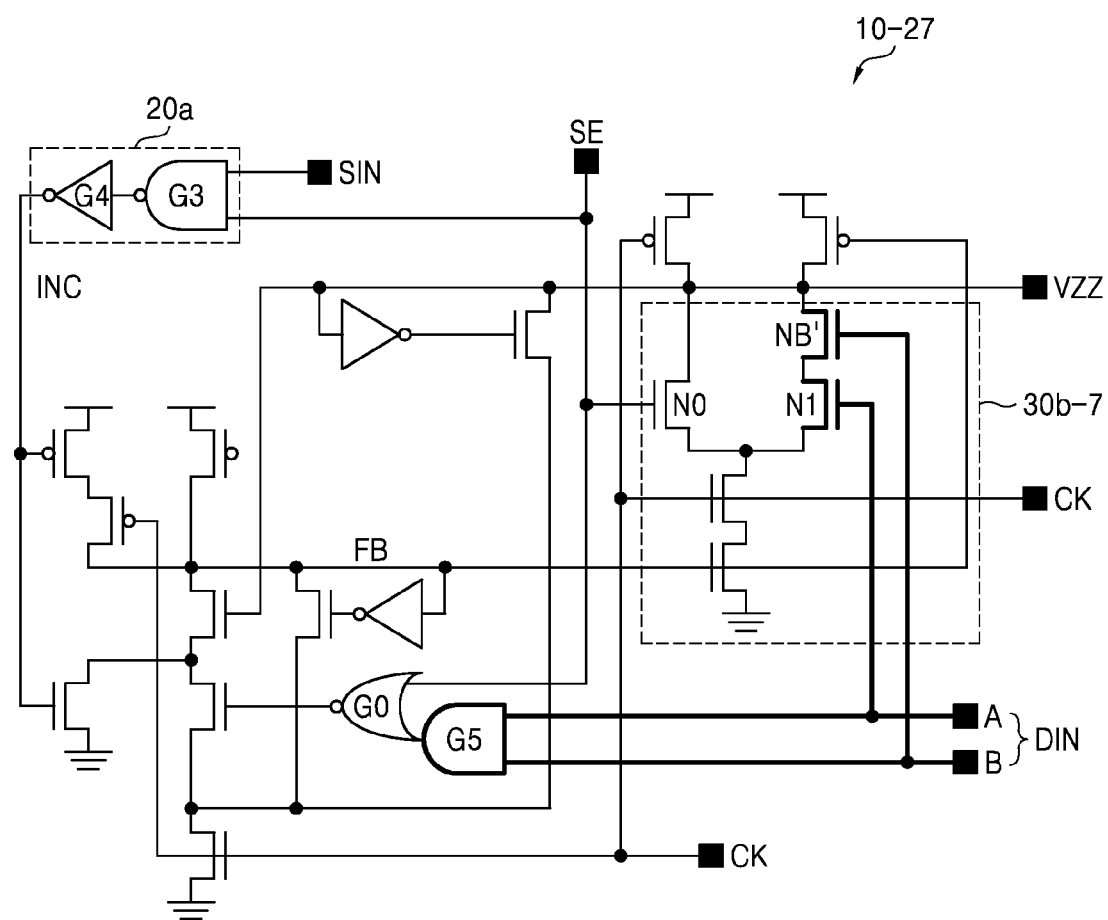

As illustrated in FIGS. 29 and 30, connections and a structure of the second logic circuit G0 may be changed variously.

The second circuit 30-1 includes a second sourcing circuit 30a and a sinking circuit 30b. The second sourcing circuit 30a may source the supply voltage Vdd to the latch input node ZZ based on the clock signal CK and the voltage of the intermediate node FB. The second sourcing circuit 30a includes a first sub sourcing circuit P0 and a second sub sourcing circuit P1.

The first sub sourcing circuit P0 may source the supply voltage Vdd to the latch input node ZZ in response to the level of the clock signal CK. The second sub sourcing circuit P1 may source the supply voltage Vdd to the latch input node ZZ in response to the voltage of the intermediate node FB. According to an exemplary embodiment, the first sub sourcing circuit P0 and the second sub sourcing circuit P1 may be connected in parallel.

During a normal operation, the sinking circuit 30b may control sinking of the data VZZ of the latch input node ZZ to the ground based on the clock signal CK, the voltage of the intermediate node FB and the data input DIN. During a scan operation, the sinking circuit 30b may control sinking of the data VZZ of the latch input node ZZ to the ground based on the clock signal CK and the voltage of the intermediate node FB.

As illustrated in FIGS. 20 to 24, connections and a structure of the sinking circuit 30b may be changed variously. According to an exemplary embodiment, a PMOS transistor which is expressed as 'P' in the exemplary embodiments may be replaced with an NMOS transistor, and an NMOS transistor which is expressed as 'N' may be replaced with a PMOS transistor.

A sourcing circuit may be called a pull-up circuit or a connection circuit. In addition, a sinking circuit may be called a pull-down circuit or a connection circuit.

Figure 4:
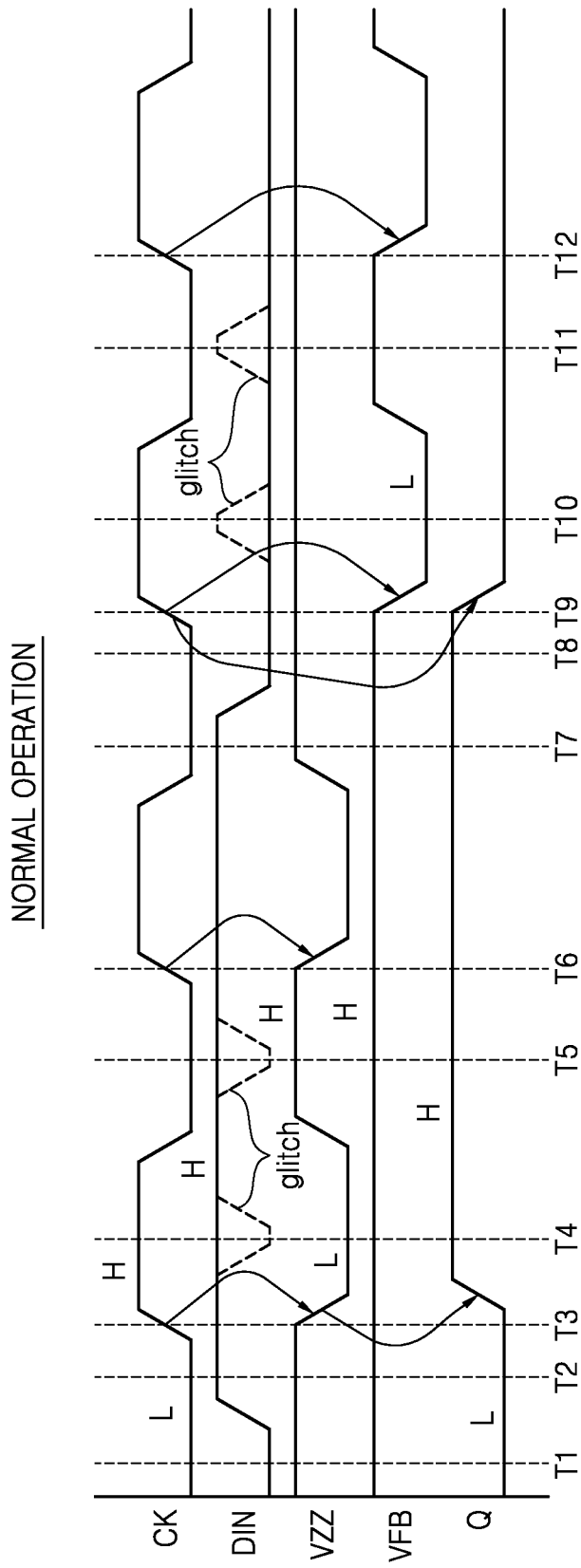
FIG. 4 is a timing diagram of input/output signals in a normal operation of the scan flip-flop illustrated in FIG. 3 according to an exemplary embodiment.

FIG. 3 depicts a connection relation of elements in a normal operation of the scan flip-flop illustrated in FIG. 2, and FIG. 4 is a timing diagram of input/output signals in the normal operation of the scan flip-flop illustrated in FIG. 3.

A normal operation of the scan flip-flop 10 is explained in detail referring to FIGS. 1 to 4. Each circuit 20-2 and 30-2 illustrated in FIG. 3 illustrates a connection relation of elements (or components) included in each circuit 20-1 and 30-1 of FIG. 2 which performs the normal operation.

Hereafter, it is assumed that a 'first phase' is one of L level and H-level, particularly H-level, and a 'second phase' is the other of L-level and H-level, more particularly the L-level.

At a time point T1, when the clock signal CK is at L-level and each of the scan enable signal SE and the data input DIN is at L-level, each transistor N0, N1, N2, N10 and N13 is turned off and each transistor P0, P10, P11 and N12 is turned on. Accordingly, each of data VZZ of the latch input node ZZ and the intermediate node voltage VFB of the intermediate node FB has H-level. Here, the latch 40 is assumed to output an output data Q having L-level.

At a time point T2, although the data input DIN is at H-level, each transistor N2 and N13 keeps an off state. Thus, each of the data VZZ and the intermediate node voltage FB keeps H-level and the latch 40 keeps the output data Q having L-level.

At a time point T3, when the data input DIN is at H-level, and the clock signal CK transits from L-level to H-level, each transistor N1, N2, and N3 is turned on. Accordingly, the data VZZ transits from H-level to L-level.

At a time point T4, the data VZZ retains at L-level by the first keeper circuit KC1. Here, although glitch occurs in the data input DIN, the intermediate node voltage VFB retains H-level regardless of the glitch.

Since the data VZZ retains L-level, a transistor P12 is turned ON and the transistor N11 is turned OFF. Accordingly, the intermediate node voltage VFB retains H-level.

The latch 40 latches the data VZZ having L-level in response to a rising edge of the clock signal CK, and outputs an output data Q having H-level.

The latch 40 is illustrated to output an output data Q having the same phase as the data input DIN in response to a rising edge of the clock signal CK; however, it may output an output data having the same phase as the data input DIN or an inverted output data having an opposite phase in response to one of a rising edge and a falling edge of the clock signal CK according to an exemplary embodiment.

At a time point T5, for example, when the data input DIN retains H-level and the clock signal CK is at L-level, the transistor P0 is turned on and the transistor N2 is turned off. The Data VZZ transits to H-level by the transistor P0. An intermediate node voltage VFB retains H-level by each transistor P10 and P11.

At a time point T6, when the clock signal CK transits from L-level to H-level, the transistor N2 is turned on and the data VZZ transits to L-level. The intermediate node voltage VFB retains at H-level by the transistor P12. Here, the data VZZ having L-level retains L-level by the first keeper circuit KC1.

The latch 40 outputs an output data Q having H-level based on the data VZZ having L-level and a rising edge of the clock signal CK.

At a time point T7, when the data input DIN is at H-level and the clock signal CK is at L-level, the transistor P0 is turned on and the transistor N2 is turned off. The Data VZZ transits to H-level by the transistor P0. The intermediate node voltage VFB retains H-level by each transistor P10 and P11. At a time point T8, when the data input DIN transits to L-level while the clock signal CK retains L-level, the transistor N1 is turned off and the data ZZ and the intermediate node voltage VFB retain H-level.

At a time point T9, when the clock signal CK transits from L-level to H-level, the transistor N1 retains an OFF state and the data VZZ retains H-level. However, each transistor N11, N12, and N13 is turned on, so that the intermediate node voltage VFB transits to L-level. As the transistor P1 is turned on, the data VZZ retains H-level.

The latch 40 latches the data VZZ having H-level based on a rising edge of the clock signal CK and outputs an output data Q having L-level.

At a time point T10, the intermediate node voltage VFB having L-level retains L-level by the second keeper circuit KC2. Although glitch occurs in the data input DIN, the intermediate node voltage VFB retains L-level by the second keeper circuit KC2 regardless of the glitch. At a time point T11, when the clock signal CK is L-level, the intermediate node voltage VFB transits to H-level by each transistor P10 and P11. When the data input DIN retains L-level, the transistor N1 retains an OFF state. Thus, the data VZZ is not discharged and retains the H-level.

At a time point T12, each transistor N11, N12 and N13 is turned on, so that the intermediate node voltage VFB is discharged to L-level.

Figure 5:
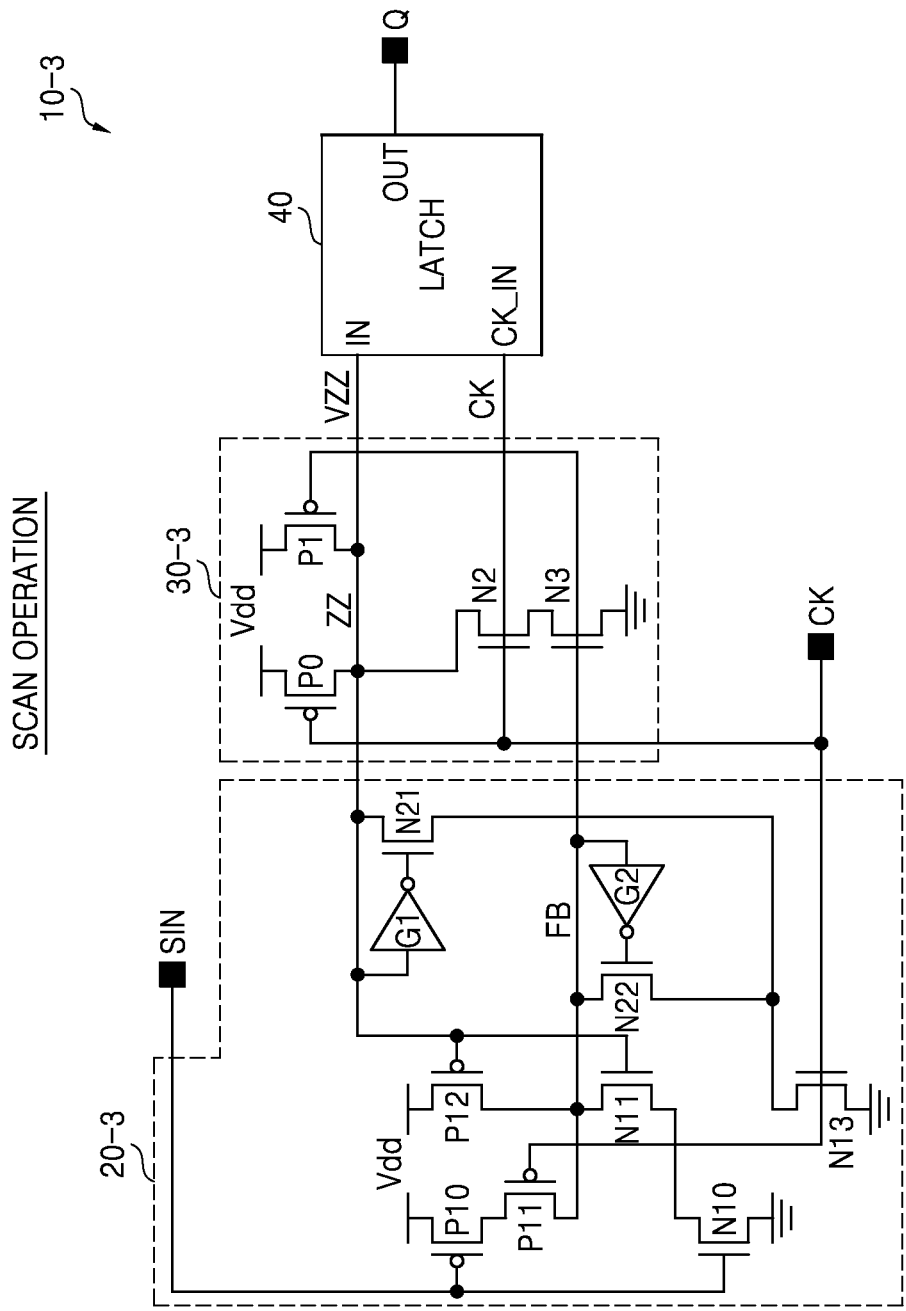
FIG. 5 depicts a connection relation of elements in a scan operation of the scan flip-flop illustrated in FIG. 2 according to an exemplary embodiment.
Figure 6:
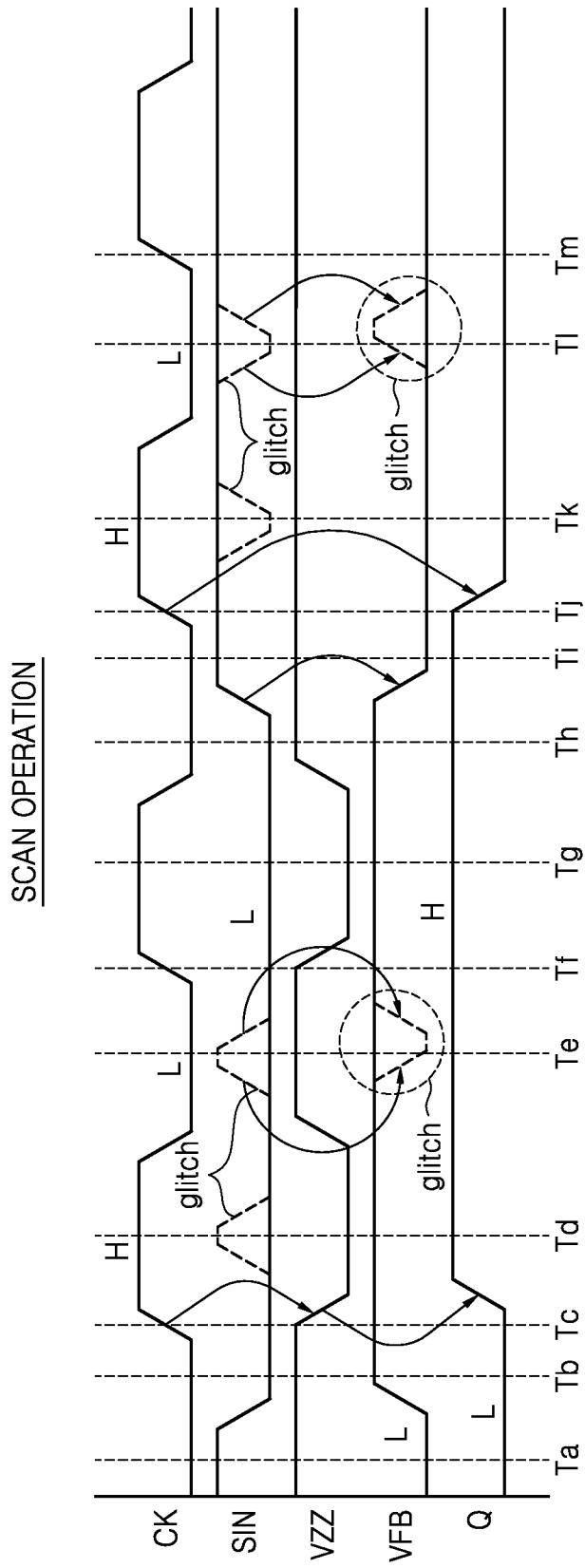
FIG. 6 is a timing diagram of input/output signals in a scan operation of the scan flip-flop illustrated in FIG. 5 according to an exemplary embodiment.

FIG. 5 depicts a connection relation of elements in a scan operation of the scan flip-flop illustrated in FIG. 2, and FIG. 6 is a timing diagram of input/output signals in the scan operation illustrated in FIG. 5. A scan operation of the scan flip-flop 10 is explained in detail referring to FIGS. 1, 2, 5 and 6. During the scan operation, the scan data SIN and the scan input INC are substantially the same signals.

Each circuit 20-3 and 30-3 illustrated in FIG. 5 illustrates a connection relation of elements included in each circuit 20-1 and 30-1 of FIG. 2 which performs the scan operation.

At a time point Ta, when the clock signal CK is at L-level and the scan input INC, i.e., the scan data SIN, is at H-level, each transistor N2, N13 and P10 is turned off and each transistor P0 and N10 is turned on. Since the data VZZ of the latch input node ZZ is at H-level, so that the transistor N11 is turned on. Accordingly, the intermediate node voltage VFB of the intermediate node FB becomes L-level. Accordingly, the transistor N3 is turned off and a transistor P1 is turned on. Here, it is assumed that the latch 40 outputs an output data Q having L-level.

At a time point Tb, when the scan data SIN is at L-level, a transistor N10 is turned off and a transistor P10 is turned on. The intermediate node voltage VFB transits to H-level by each transistor P10 and P11. Accordingly, the transistor N3 is turned on and the transistor P1 is turned off. Here, the data VZZ retains H-level according to the clock signal CK having L-level.

At a time point Tc, when the clock signal CK transits from L-level to H-level, each transistor P0 and P11 is turned off and each transistor N2 and N13 is turned on. Accordingly, the data VZZ transits from H-level to L-level. The data VZZ retains L-level by the first keeper circuit KC1.

The latch 40 latches the data VZZ having L-level based on a rising edge of the clock signal CK, and outputs an output data Q having H-level. As described above, the latch 40 may output an output data Q having a phase that is contrary to the scan data SIN but identical to the data VZZ.

At a time point Td, since each transistor N10 and P11 retains an off state even though glitch occurs in the scan data SIN, the glitch may not affect the intermediate node voltage VFB. At a time point Te, i.e., when the clock signal CK is at L-level, the transistor P0 is turned on and the transistor N2 is turned off. The data VZZ transits to H-level by the transistor P0.

In response to the clock signal CK having L-level, the transistor N13 is turned off and the transistor P11 is turned on. The intermediate node voltage VFB retains H-level by each transistor P10 and P11. However, when the scan input SIN transits from L-level to H-level by glitch, the transistor P10 is turned off and the transistor N10 is turned on.

When the transistor N10 is turned on by glitch while the transistor N11 retains an on state, the intermediate node voltage VFB is discharged to a ground through the transistors N10 and N11. That is, when the clock signal CK is at L-level, glitch included in the scan data SIN affects the intermediate node voltage VFB.

When the clock signal is at H-level, e.g., at a time point Td, the intermediate node voltage VFB is not synchronized with the scan data SIN; however, the intermediate node voltage VFB is synchronized with the scan data SIN when the clock signal CK is at L-level, e.g., at a time point Te. Here, synchronization includes a case when each phase of two signals is identical or contrary to each other.

At a time point Tf, when the clock signal CK transits from L-level to H-level, the data VZZ transits to L-level through each transistor N2 and N3. The data VZZ retains L-level by the first keeper circuit KC1. The intermediate node voltage VFB retains H-level by the transistor P12. The latch 40 latches the data VZZ having L-level in response to a rising edge of the clock signal CK and outputs an output data Q having H-level.

An operation of a scan flip-flop 10-3 at a time point Tg is the same as an operation of the scan flip-flop 10-3 at a time point Td. When the clock signal CK is at L-level and the scan data SIN is at L-level at a time point Th, the transistor P0 is turned on and the transistor N2 is turned off. The data VZZ transits to H-level by the transistor P0. The intermediate node voltage VFB retains H-level by each transistor P10 and P11. However, between a time point Th and a time point Ti, when the scan data SIN transits from L-level to H-level while the clock signal CK retains L-level, the transistor P10 is turned off and the transistor N10 is turned on.

Each transistor N10 and N11 is turned on, so that the intermediate node voltage VFB is discharged from H-level to L-level. Accordingly, the transistor N3 is turned off and the transistor P1 is turned on, so that the data VZZ retains H-level.

At a time point Tj, since the transistor N3 retains an off state when the clock signal CK transits from L-level to H-level, the data VZZ retains H-level. However, each transistor N10, N11 and N13 is turned on, so that the intermediate node voltage VFB is discharged to L-level. Here, the second keeper circuit KC2 keeps the intermediate node voltage at L-level.

The second latch 40 latches the data VZZ having H-level in response to a rising edge of the clock signal CK and outputs an output data Q having L-level.

At a time point Tk, the intermediate node voltage VFB retains L-level by the second keeper circuit KC2 even though glitch occurs in the scan data SIN. At a time point T1, when the clock signal CK is at L-level, the data VZZ retains H-level by the transistor P0. Here, the intermediate node voltage VFB retains L-level by each transistor N10 and N1 and the second keeper circuit KC2. However, when the scan data SIN transits from H-level to L-level because of glitch, the transistor N10 is turned off and the transistor P10 is turned on. Since each transistor P10 and P11 is turned on, a supply voltage Vdd is supplied to the intermediate node FB. Accordingly, the intermediate node voltage VFB is changed due to glitch included in the scan data SIN.

As described above, the intermediate node voltage VFB is not synchronized with the scan data SIN when the clock signal CK is at H-level, e.g., at a time point Tk, but the intermediate node voltage VFB is synchronized with the scan data SIN when the clock signal CK is at L-level, e.g., at a time point Tl. Here, each phase of two signals SIN and VFB is contrary to each other; however, glitch of the scan data SIN affects the intermediate node voltage VFB.

At a time point Tm, when the clock signal CK transits from L-level to H-level, the data VZZ retains H-level by the transistor P1 and the intermediate node voltage VFB retains L-level by the transistors N10 and N11.

The latch 40 latches the data VZZ having H-level in response to a rising edge of the clock signal CK and outputs an output data Q having L-level.

As illustrated in FIG. 6, a result of performing an AND operation on the clock signal CK and the intermediate node voltage VFB, e.g., an overlap section, corresponds to a half cycle of the clock signal CK.

FIGS. 7 to 25 are circuit diagrams depicting other exemplary embodiments of the scan flip-flop illustrated in FIG. 1. Except for a part marked in a bold line, a structure and an operation of the scan flip-flop 10-1 of FIG. 2 is substantially the same as a structure and operations of each scan flip-flop 10-4 to 10-22 illustrated in FIGS. 7 to 25.

For convenience of explanation, no latch is illustrated in the scan flip-flops 10-4 to 10-22 illustrated in FIGS. 7 to 25. However, a latch input node ZZ is connected to an input terminal IN of the latch 40 and a clock signal CK is supplied to a control terminal.

The first keeper circuit KC1 illustrated in FIG. 7 includes an inverter G1 and an NMOS transistor N21. Referring to FIGS. 2, 3 and 7, a first logic circuit 20a may output a scan input INC having L-level based on a scan enable signal INB (=SE) having L-level during a normal operation. In addition, the first logic circuit 20a may output a scan input INC having the same phase as the scan data SIN based on the scan enable signal INB (=SE) having H-level during a scan operation.

The first logic circuit 20a includes all logic circuits which may output the scan input INC having L-level or the scan input INC having the same phase as the scan data SIN according to a level of the scan enable signal INB (=SE).

An NMOS transistor N21 of FIG. 7 is gated in response to an output signal of the inverter G1, and connected between a latch input node ZZ and a first node ND1. The first node ND1 is a common node of transistors N12 and N13.

A first keeper circuit KC1-1 illustrated in FIG. 8 includes the inverter G1 and the NMOS transistor N21. The NMOS transistor N21 is gated in response to an output signal of the inverter G1 and connected between the latch input node ZZ and a second node ND2. Referring to FIGS. 2 and 8, the second node ND2 is a common node of transistors N0, N1 and N2.

Referring to FIGS. 2 and 8, the first keeper circuit KC1-1 may discharge the data VZZ through the second circuit 30-1.

A first keeper circuit KC1-2 illustrated in FIG. 9 includes the inverter G1 and the NMOS transistor N21. The NMOS transistor N21 is gated in response to an output signal of the inverter G1 and connected between the latch input node ZZ and a third node ND3. Referring to FIGS. 2 and 9, the third node ND3 is a common node of transistors N2 and N3.

Referring to FIGS. 2 and 9, the first keeper circuit KC1-2 may discharge the data VZZ through the second circuit 30-1.

Figure 10:
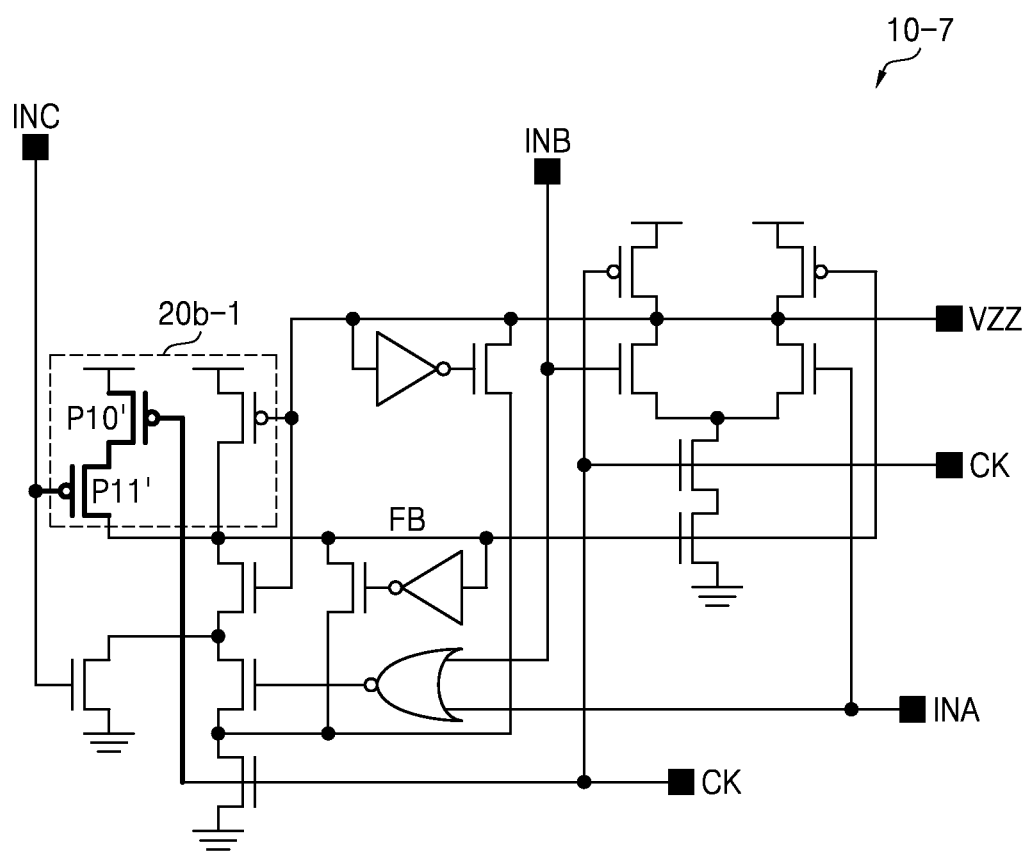

FIG. 10 is a circuit diagram depicting another exemplary embodiment of the scan flip-flop illustrated in FIG. 1. Referring to FIG. 2, the scan input INC is supplied to the transistor P10 of the first sourcing circuit 20b and the clock signal CK is supplied to the transistor P11 of the first sourcing circuit 20b. However, the scan input INC of FIG. 10 is supplied to a transistor P11' of a sourcing circuit 20b-1 and a clock signal CK is supplied to a transistor P10' of the first sourcing circuit 20b-1.

Figure 11:
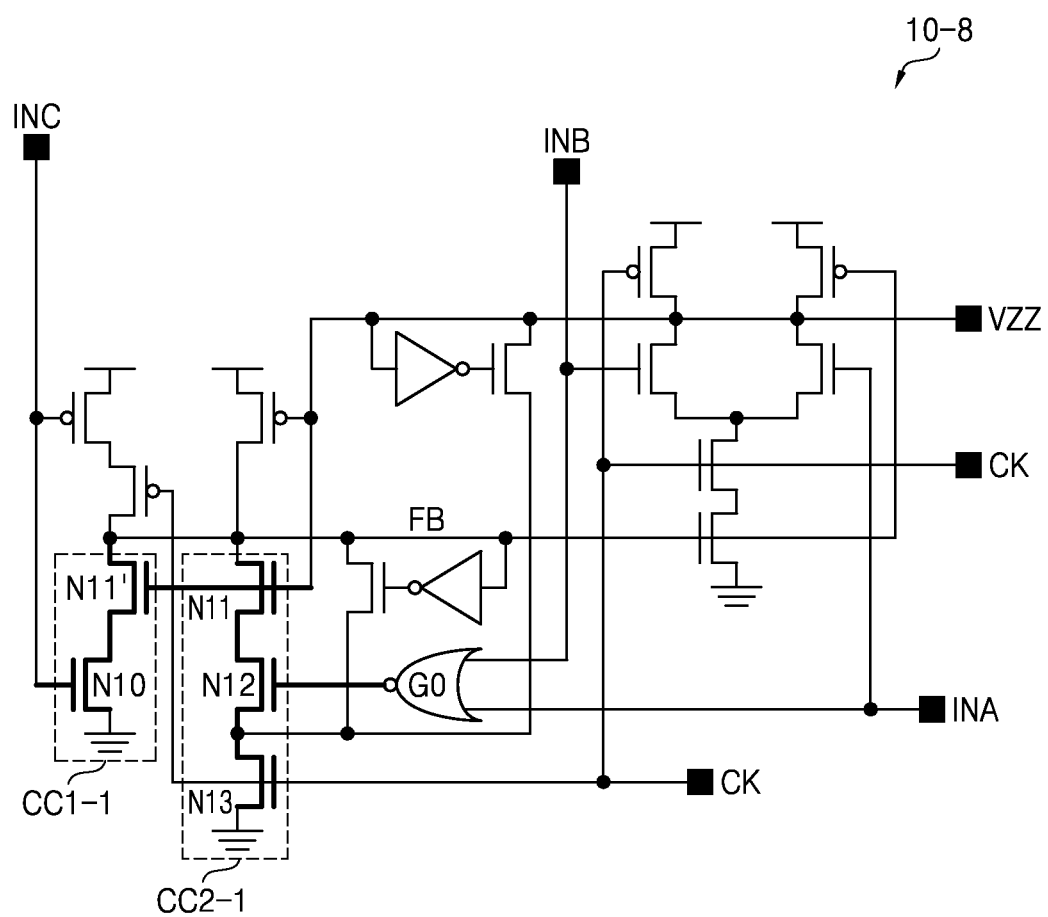

FIG. 11 is a circuit diagram depicting still another exemplary embodiment of the scan flip-flop illustrated in FIG. 1. Referring to FIGS. 2 and 11, a first connection circuit CC1-1 of FIG. 11 controls connection between the intermediate node FB and the ground node based on the scan input INC and the data VZZ of the latch input node ZZ.

The first connection circuit CC1-1 includes transistors N10 and N11' connected in series between the intermediate node FB and the ground node. The data VZZ is supplied to a gate of a transistor N11', and the scan input INC is supplied to a gate of a transistor N10.

A second connection circuit CC2-1 controls connection between the intermediate node FB and the ground node based on the data VZZ, an output signal of a second logic circuit G0 and the clock signal CK. The second connection circuit CC2-1 includes transistors N11 to N13 connected in series between the intermediate node FB and the ground node. The data VZZ is supplied to a gate of a transistor N11, an output signal of the second logic circuit G0 is supplied to a gate of a transistor N12, and the clock signal CK is supplied to a gate of a transistor N13.

Figure 12:
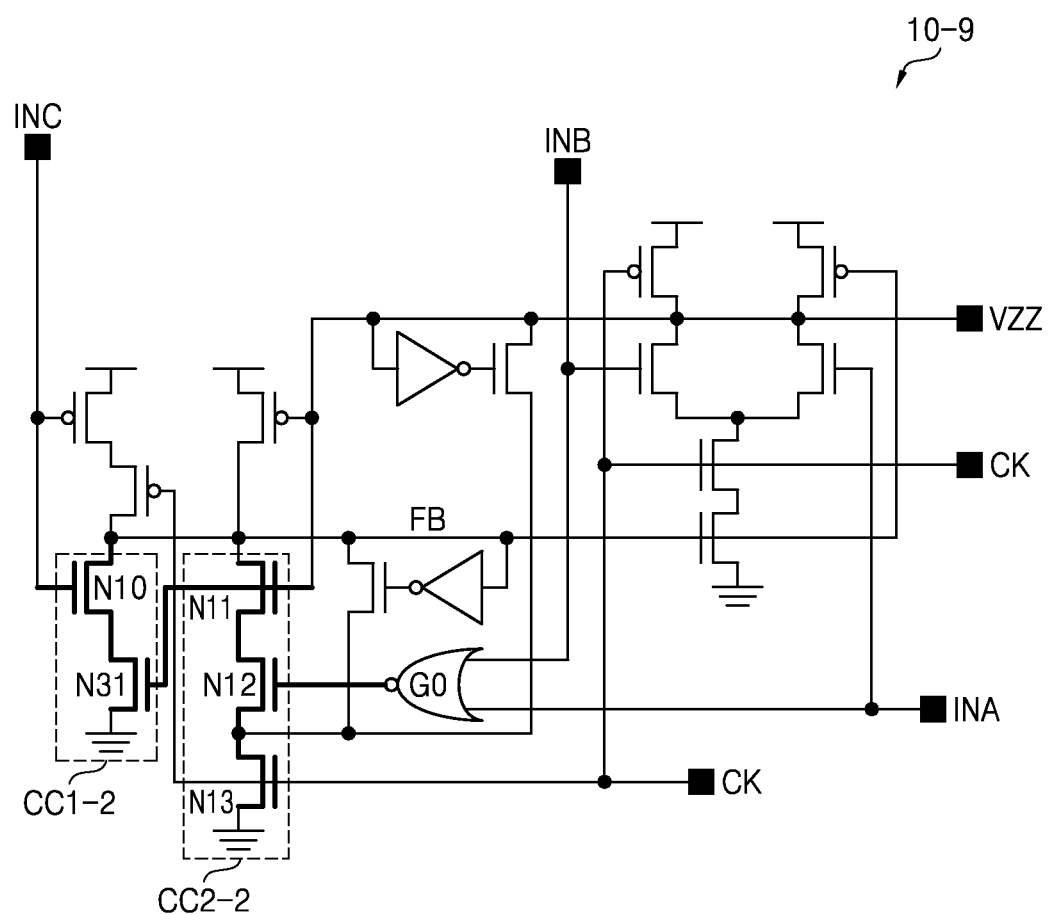

FIG. 12 is a circuit diagram depicting still another exemplary embodiment of the scan flip-flop illustrated in FIG. 1. Referring to FIGS. 2 and 12, a first connection circuit CC1-2 of FIG. 12 controls connection between the intermediate node FB and the ground node based on a scan input INC and data VZZ of the latch input node ZZ.

The first connection circuit CC1-2 includes transistors N10 and N31 connected in series between the intermediate node FB and the ground node. The scan input INC is supplied to a gate of a transistor N10 and the data VZZ is supplied to a gate of a transistor N31.

A second connection circuit CC2-2 controls connection between the intermediate node FB and the ground node based on the data VZZ, an output signal of the second logic circuit G0 and the clock signal CK. The second connection circuit CC2-2 includes transistors N11 to N13 connected in series between the intermediate node FB and the ground node. The data VZZ is supplied to a gate of the transistor N11, an output signal of the second logic circuit G0 is supplied to a gate of the transistor N12, and the clock signal CK is supplied to a gate of the transistor N13.

Figure 13:
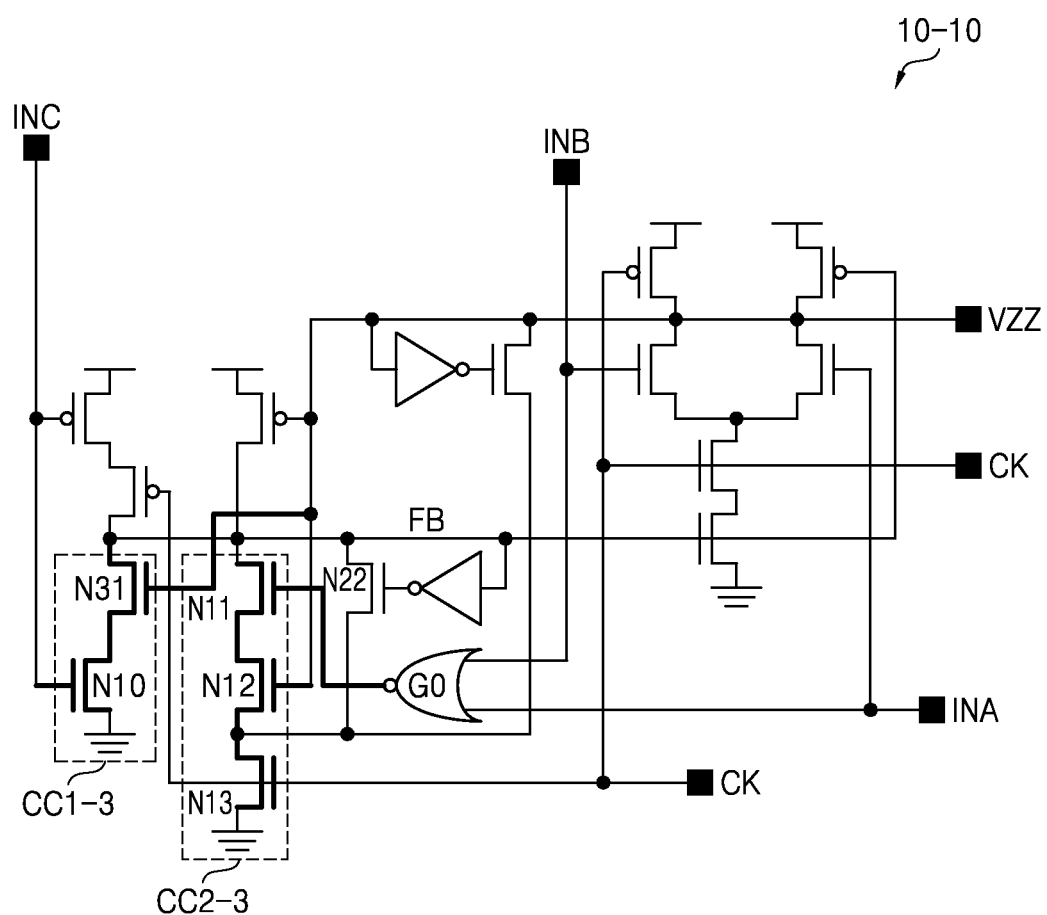

FIG. 13 is a circuit diagram depicting still another exemplary embodiment of the scan flip-flop illustrated in FIG. 1. Referring to FIGS. 2 and 13, a first connection circuit CC1-3 of FIG. 13 controls connection between the intermediate node FB and the ground node based on the scan input INC and the data VZZ of the latch input node ZZ.

The first connection circuit CC1-3 includes transistors N31 and N10 connected in series between the intermediate node FB and the ground node. The data VZZ is supplied to a gate of a transistor N31 and the scan input INC is supplied to a gate of a transistor N10.

A second connection circuit CC2-3 controls connection between the intermediate node FB and the ground node based on an output signal of the second logic circuit G0, the data VZZ and the clock signal CK. The second connection circuit CC2-3 includes transistors N11 to N13 connected in series between the intermediate node FB and the ground node. An output signal of the second logic circuit G0 is supplied to a gate of the transistor N11, the data VZZ is supplied to a gate of the transistor N12, and the clock signal CK is supplied to a gate of the transistor N13.

FIG. 14 is a circuit diagram depicting still another exemplary embodiment of the scan flip-flop illustrated in FIG. 1. Referring to FIGS. 13 and 14, except for connection of a second keeper circuit KC2-1, a structure of a scan flip-flop 10-10 of FIG. 13 is substantially the same as a structure of a scan flip-flop 10-11 of FIG. 14. A transistor N22 of FIG. 13 is connected between a common node of transistors N12 and N13 and the intermediate node FB. However, the transistor N22 of FIG. 14 is connected between a common node of transistors N11 and N12 and the intermediate node.

Figure 15:
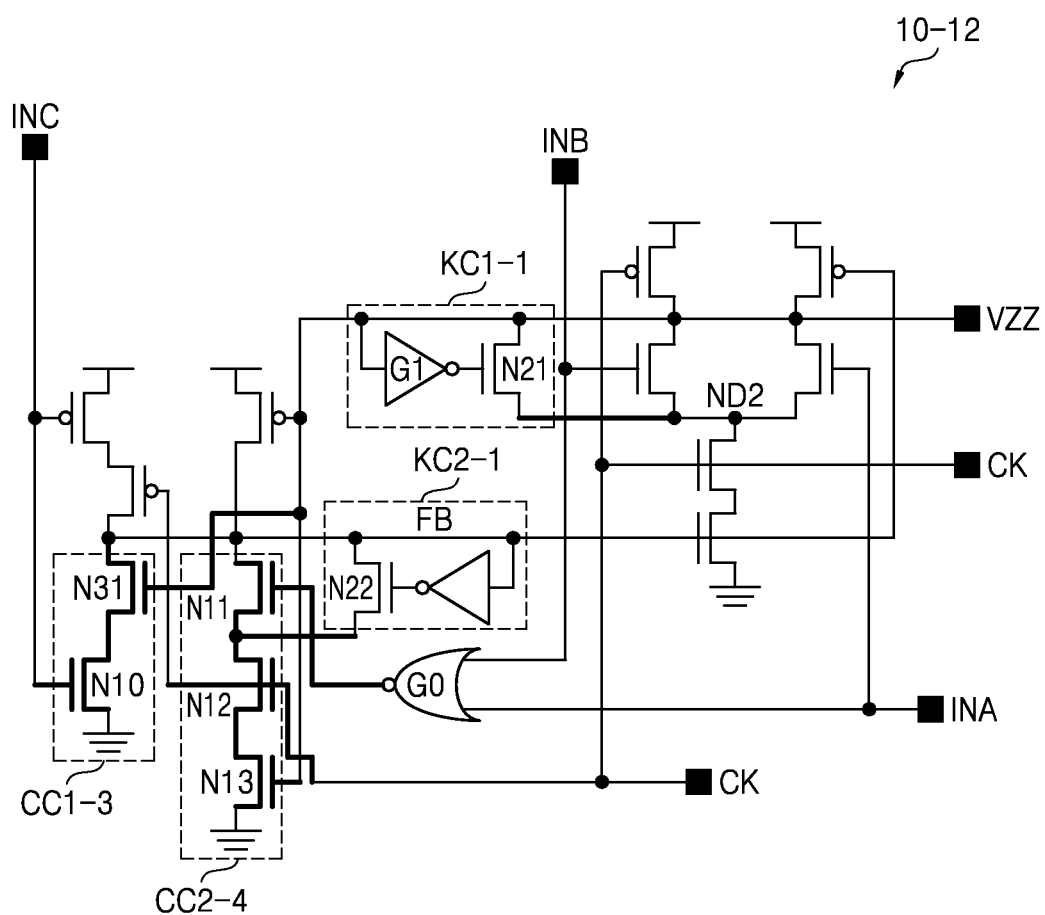

FIG. 15 is a circuit diagram depicting still another exemplary embodiment of the scan flip-flop illustrated in FIG. 1. Referring to FIGS. 14 and 15, except for connection of a second connection circuit CC2-4 and connection of the first keeper circuit KC1-1, the scan flip-flop 10-11 of FIG. 14 has substantially the same structure as a scan flip-flop 10-12 of FIG. 15.

The second connection circuit CC2-4 of FIG. 15 controls connection between the intermediate node FB and the ground node based on an output signal of the second logic circuit G0, a clock signal CK and data VZZ.

The second connection circuit CC2-4 includes transistors N11 to N13 connected in series between the intermediate node FB and the ground node. An output signal of the second logic circuit G0 is supplied to a gate of a transistor N11, the clock signal CK is supplied to a gate of a transistor N12, and the data VZZ is supplied to a gate of a transistor N13.

The first keeper circuit KC1-1 is connected between the latch input node ZZ and the second node ND2. A transistor N22 of the second keeper circuit KC2-1 is connected between a common node of transistors N11 and N12 and the intermediate node FB.

FIG. 16 is a circuit diagram depicting still another exemplary embodiment of the scan flip-flop illustrated in FIG. 1. Referring to FIGS. 15 and 16, except for connection of a second keeper circuit KC2, a structure of the scan flip-flop 10-12 of FIG. 15 is equal to a structure of a scan flip-flop 10-13 of FIG. 16.

A transistor N22 of a second keeper circuit KC2-1 of FIG. 15 is connected between a common node of transistors N11 and N12 and the intermediate node FB. However, a transistor N22 of the second keeper circuit KC2 of FIG. 16 is connected between a common node of transistors N12 and N13 and the intermediate node FB.

Figure 17:
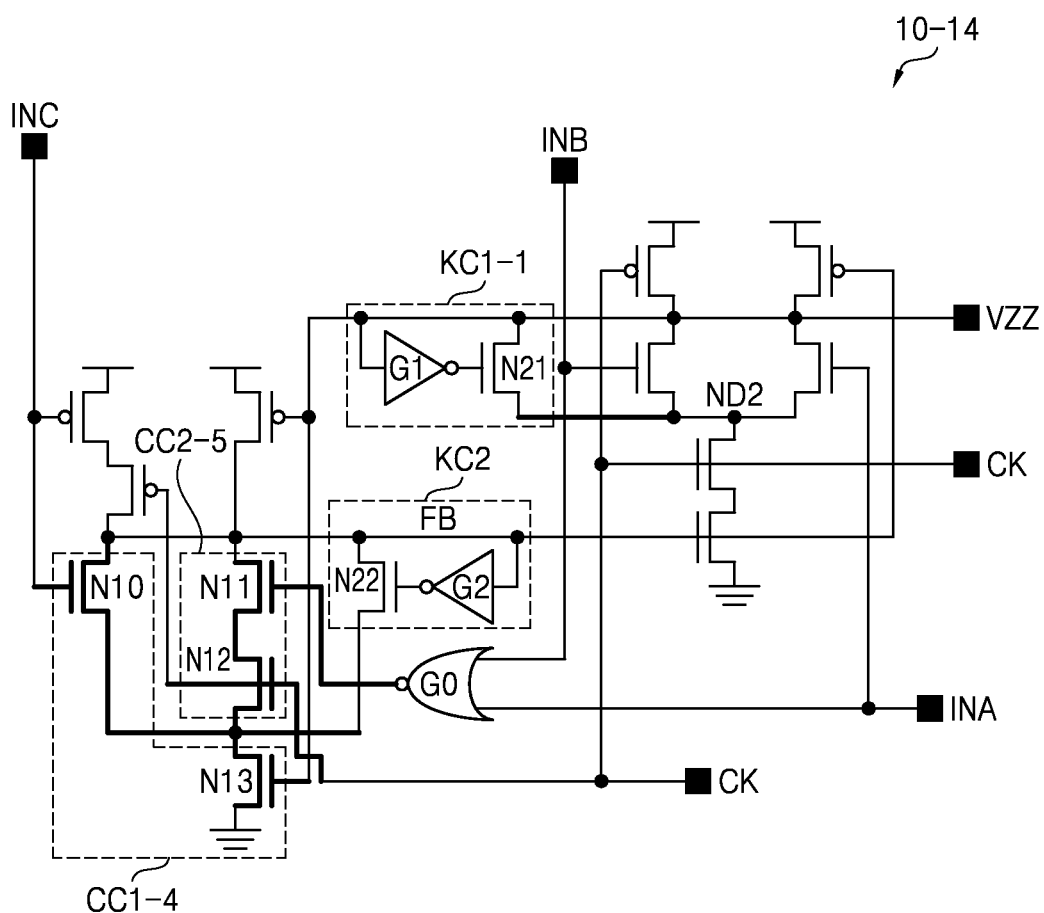

FIG. 17 is a circuit diagram depicting still another exemplary embodiment of the scan flip-flop illustrated in FIG. 1. Referring to FIGS. 16 and 17, except for connection of a first connection circuit CC 1-4 and connection of a second connection circuit CC2-5, a structure of the scan flip-flop 10-13 of FIG. 16 is the same as a structure of a scan flip-flop 10-14 of FIG. 17.

The first connection circuit CC1-4 of FIG. 17 controls connection between the intermediate node FB and the ground node based on the scan input INC and the data VZZ.

The first connection circuit CC1-4 includes transistors N10 and N13 connected in series between the intermediate node FB and the ground node. The scan input INC is supplied to a gate of a transistor N10, and the data VZZ is supplied to a gate of a transistor N13.

The second connection circuit CC2-5 controls connection between the intermediate node FB and the first connection circuit CC1-4 based on an output signal of the second logic circuit G0 and a clock signal CK. The second connection circuit CC2-5 includes transistors N11 and N12 connected in series between the intermediate node FB and the first connection circuit CC1-4. An output signal of the second logic circuit G0 is supplied to a gate of a transistor N11, and the clock signal CK is supplied to a gate of a transistor N12.

Figure 18:
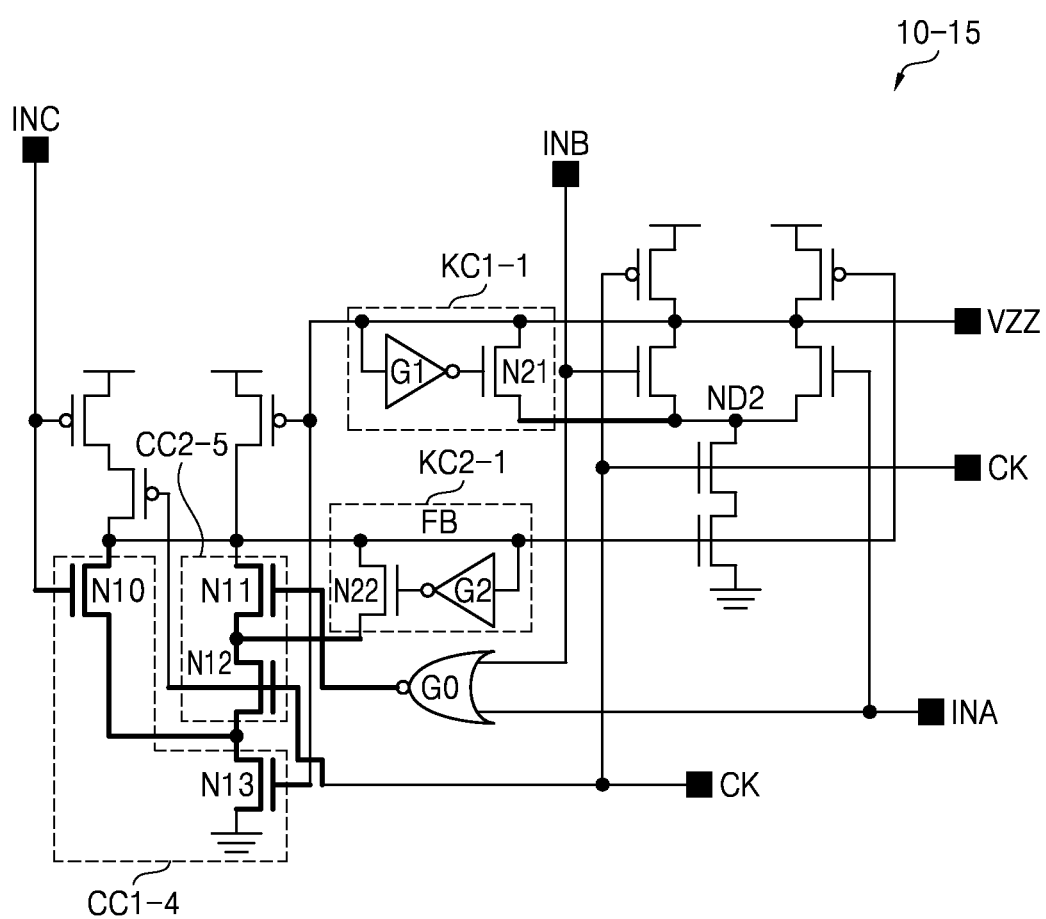

FIG. 18 is a circuit diagram depicting still another exemplary embodiment of the scan flip-flop illustrated in FIG. 1. Referring to FIGS. 17 and 18, except for connection of a second keeper circuit KC2-1, a structure of the scan flip-flop 10-14 of FIG. 17 is the same as a structure of a scan flip-flop 10-15 of FIG. 18. A transistor N22 of a second keeper circuit KC2 of FIG. 17 is connected between a common node of transistors N12 and N13 and the intermediate node FB. However, a transistor N22 of the second keeper circuit KC2-1 of FIG. 18 is connected between a common node of transistors N11 and N12 and the intermediate node FB.

Figure 19:
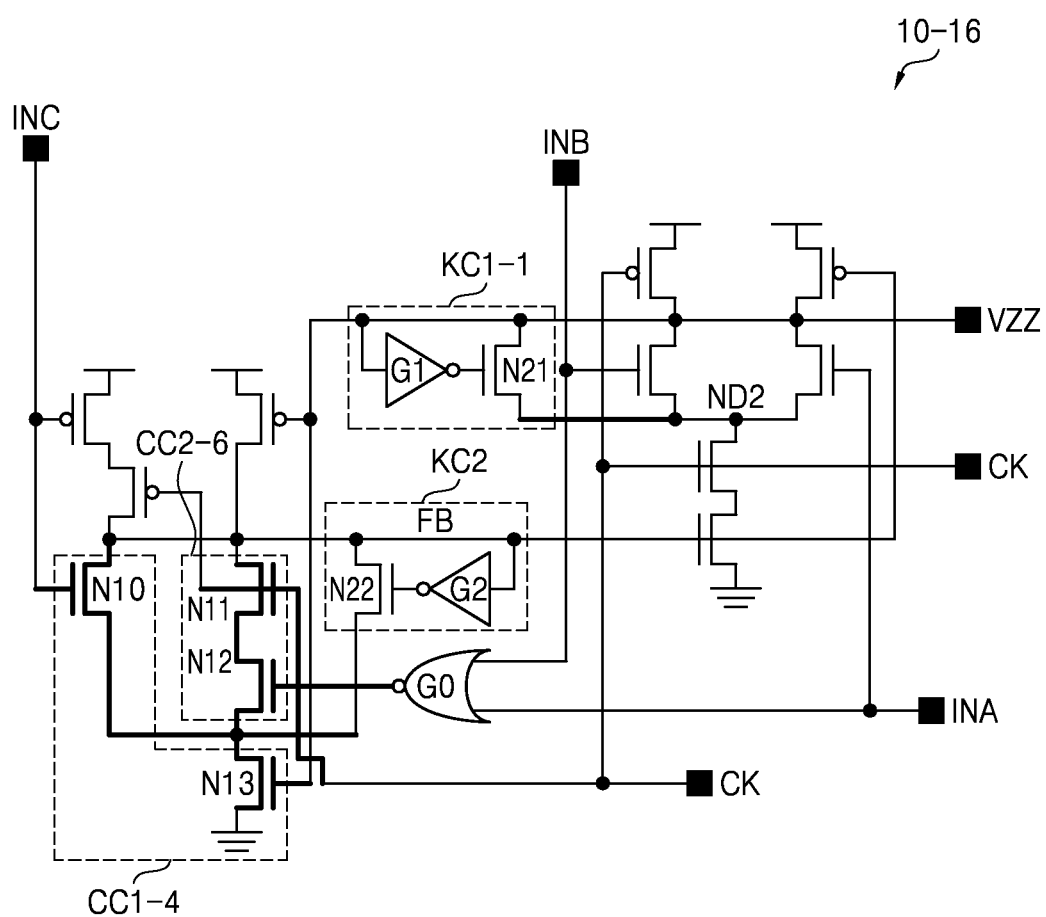

FIG. 19 is a circuit diagram depicting still another exemplary embodiment of the scan flip-flop illustrated in FIG. 1. Referring to FIGS. 17 and 19, except for connection of a second connection circuit CC2-6, a structure of the scan flip-flop 10-14 of FIG. 17 is the same as a structure of a scan flip-flop 10-16 of FIG. 19. An output signal of the second logic circuit G0 is supplied to a gate of the transistor N11, and a clock signal CK is supplied to a gate of the transistor N12 in FIG. 17. However, the clock signal CK is supplied to a gate of the transistor N11, and an output signal of the second logic circuit G0 is supplied to a gate of the transistor N12 in FIG. 19.

Figure 20:
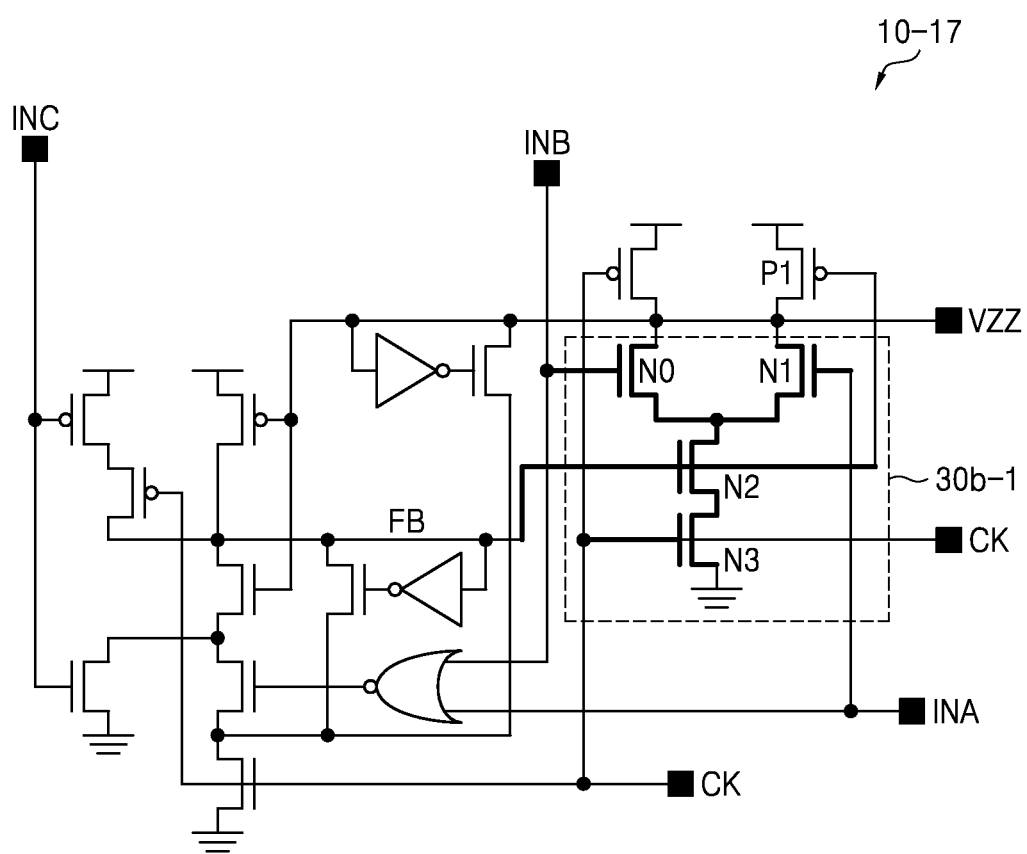

FIG. 20 is a circuit diagram depicting still another exemplary embodiment of the scan flip-flop illustrated in FIG. 1. Referring to FIGS. 2 and 20, except for connection of the sinking circuit 30b-1, a structure of the scan flip-flop 10-1 of FIG. 2 is substantially the same as a structure of a scan flip-flop 10-17 of FIG. 20.

The clock signal CK is supplied to a gate of the transistor N2, and the intermediate node FB is connected to a gate of each transistor P1 and N3 in FIG. 2. However, the clock signal CK is supplied to a gate of a transistor N3 and the intermediate node FB is connected to a gate of each transistor P1 and N2 in FIG. 20.

Figure 21:
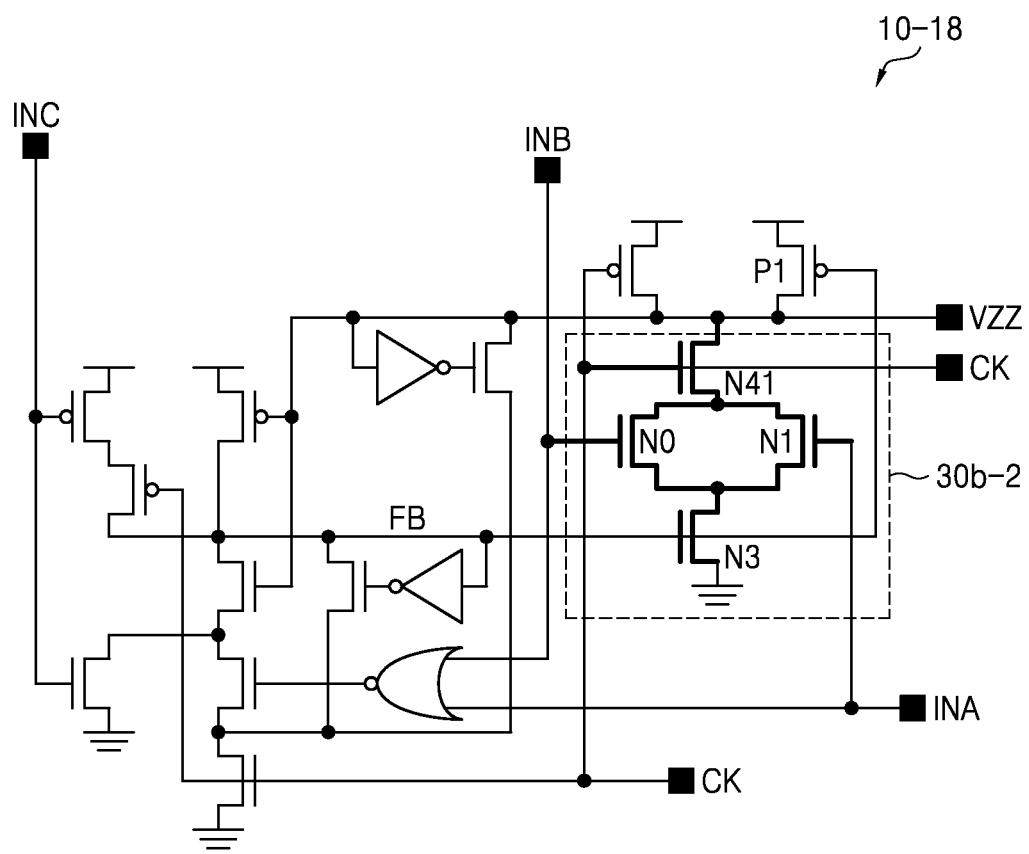

FIG. 21 is a circuit diagram depicting still another exemplary embodiment of the scan flip-flop illustrated in FIG. 1. Referring to FIGS. 2 and 21, except for connection of a sinking circuit 30b-2, a structure of the scan flip-flop 10-1 of FIG. 2 is the same as a structure of a scan flip-flop 10-18 of FIG. 21.

In FIG. 2, the clock signal CK is supplied to a gate of the transistor N2, and the intermediate node FB is connected to a gate of each transistor P1 and N3. However, the clock signal CK is supplied to a gate of a transistor N41, and the intermediate node FB is connected to a gate of each transistor P1 and N3 in FIG. 21.

Figure 22:
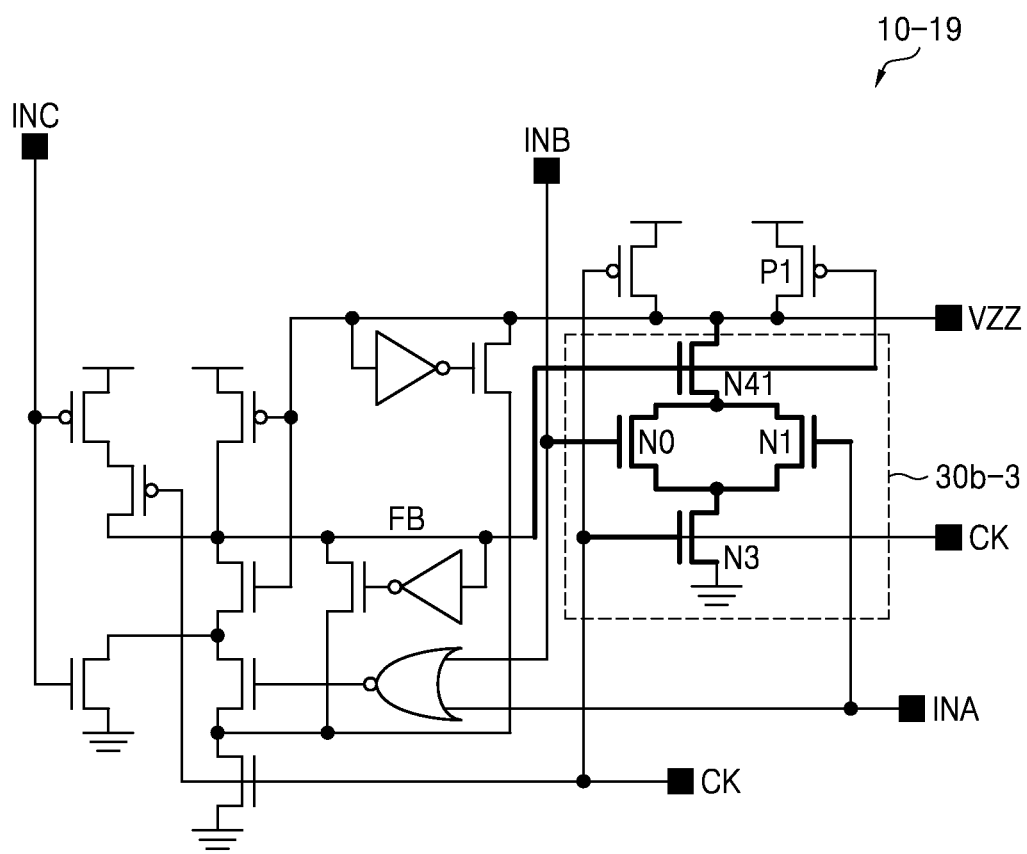

FIG. 22 is a circuit diagram depicting still another exemplary embodiment of the scan flip-flop illustrated in FIG. 1. Referring to FIGS. 21 and 22, except for connection of a sinking circuit 30b-3, a structure of the scan flip-flop 10-18 of FIG. 21 is the same as a structure of a scan flip-flop 10-19 of FIG. 22.

In FIG. 21, the clock signal CK is supplied to a gate of the transistor N41, and the intermediate node FB is connected to a gate of each transistor P1 and N3. However, the clock signal CK is supplied to a gate of a transistor N3 and the intermediate node FB is connected to a gate of each transistor P1 and N41 in FIG. 22.

Figure 23:
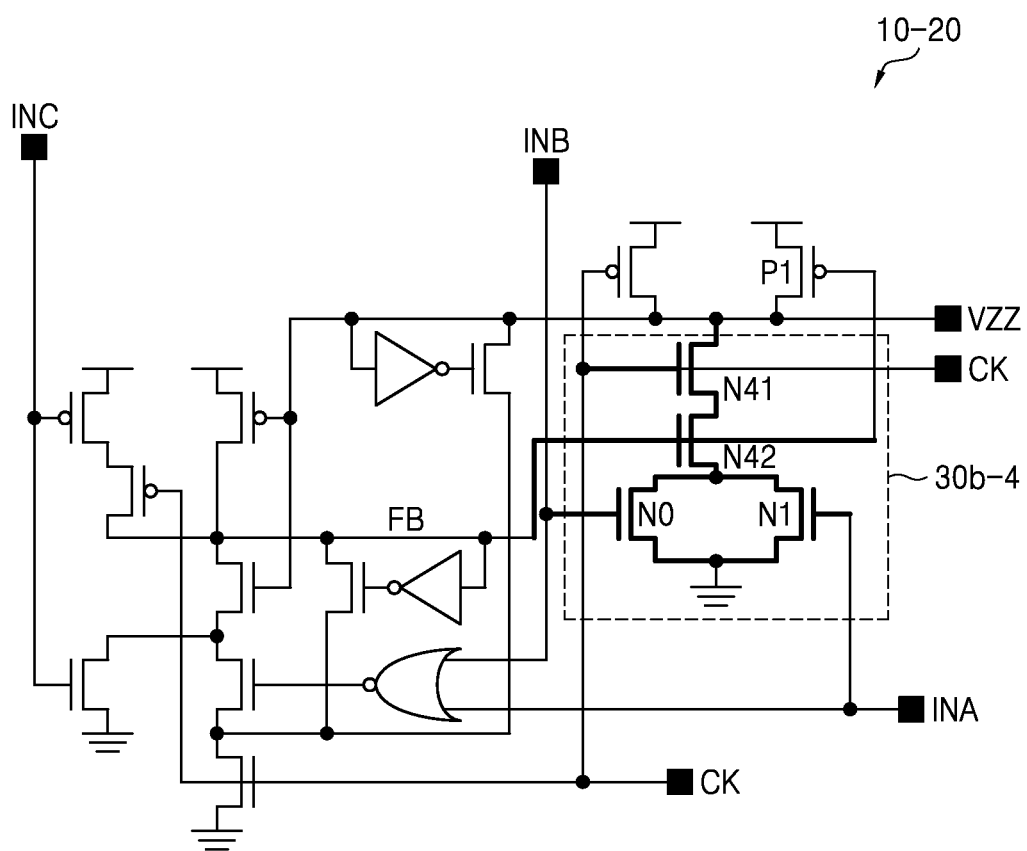

FIG. 23 is a circuit diagram depicting still another exemplary embodiment of the scan flip-flop illustrated in FIG. 1. Referring to FIGS. 2 and 23, except for connection of a sinking circuit 30b-4, a structure of the scan flip-flop 10-1 of FIG. 2 is substantially the same as a structure of a scan flip-flop 10-20 of FIG. 23.

In FIG. 2, the clock signal CK is supplied to a gate of the transistor N2, and the intermediate node FB is connected to a gate of each transistor P1 and N3. However, the clock signal CK is supplied to a gate of a transistor N41, and the intermediate node FB is connected to a gate of each transistor P1 and N42 in FIG. 23.

Figure 24:
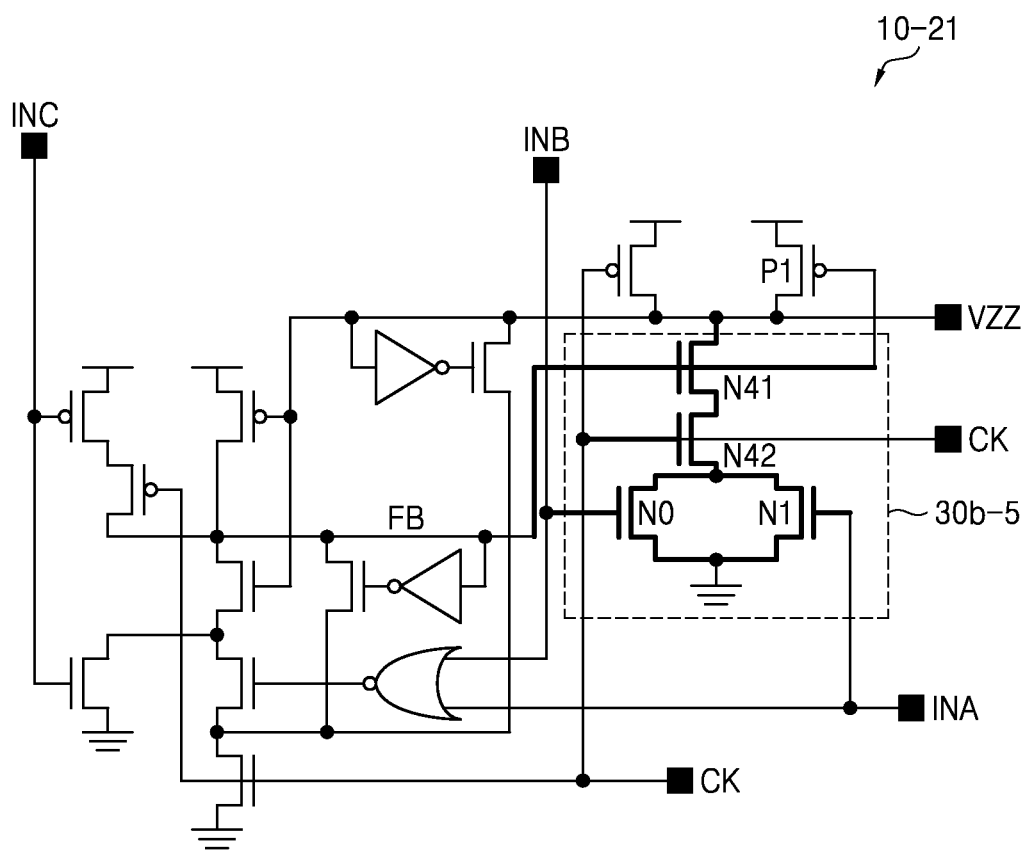

FIG. 24 is a circuit diagram depicting still another exemplary embodiment of the scan flip-flop illustrated in FIG. 1. Referring to FIGS. 2 and 24, except for connection of a sinking circuit 30b-5, a structure of the scan flip-flop 10-1 of FIG. 2 is substantially the same as a structure of a scan flip-flop 10-21 of FIG. 24.

In FIG. 2, the clock signal CK is supplied to a gate of the transistor N2, and the intermediate node FB is connected to a gate of each transistor P1 and N3. However, the clock signal CK is supplied to a gate of a transistor N42 and the intermediate node FB is connected to a gate of each transistor P1 and N41 in FIG. 24.

Figure 25:
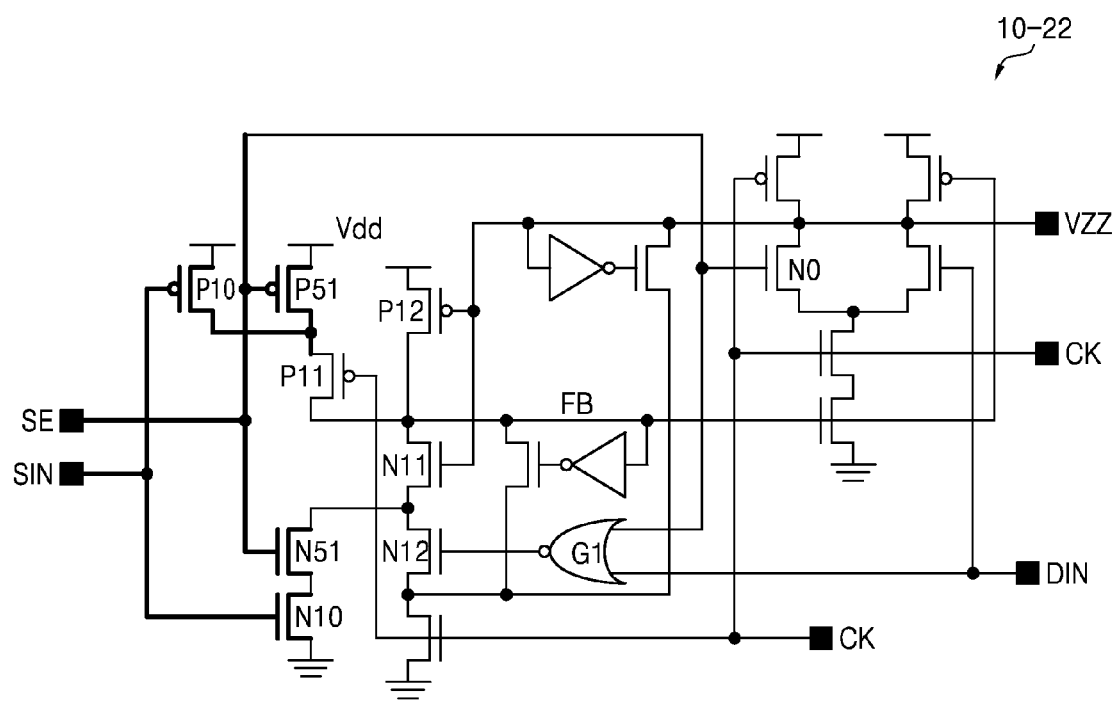

FIG. 25 is a circuit diagram depicting still another exemplary embodiment of the scan flip-flop illustrated in FIG. 1. Referring to FIGS. 2 and 25, except for a transmission path of a scan enable signal SE and a transmission path of scan data SIN, a structure of the scan flip-flop 10-1 of FIG. 2 is substantially the same as a structure of a scan flip-flop 10-22 of FIG. 25.

The scan flip-flop 10-22 of FIG. 25 does not include a logic circuit which may perform a logical combination on the scan enable signal SE and the scan data SIN. However, the scan data SIN may be also called a scan input in this case.

The scan enable signal SE is supplied to a gate of each transistor N0, P51, and N51 and a second logic circuit G0, the scan data SIN is directly supplied to a gate of each transistor P10 and N10.

A transistor P51 is connected between a power node and a transistor P11. A transistor N51 is connected between a common node of transistors N11 and N12 and a transistor N10.

Each transistor N0 and N51 is turned off and a transistor P51 is turned on during a normal operation, i.e., when a scan enable signal SE is at L-level, so that a structure of the scan flip-flop 10-22 of FIG. 25 becomes substantially equal to a structure of the scan flip-flop 10-2 of FIG. 3. During a scan operation, i.e., when the scan enable signal SE is at H-level, each transistor P51 and N12 becomes turned off and a transistor N0 is turned on, so that a structure of the scan flip-flop 10-22 of FIG. 25 becomes substantially equal to a structure of the scan flip-flop 10-3 of FIG. 5.

Figure 26A:
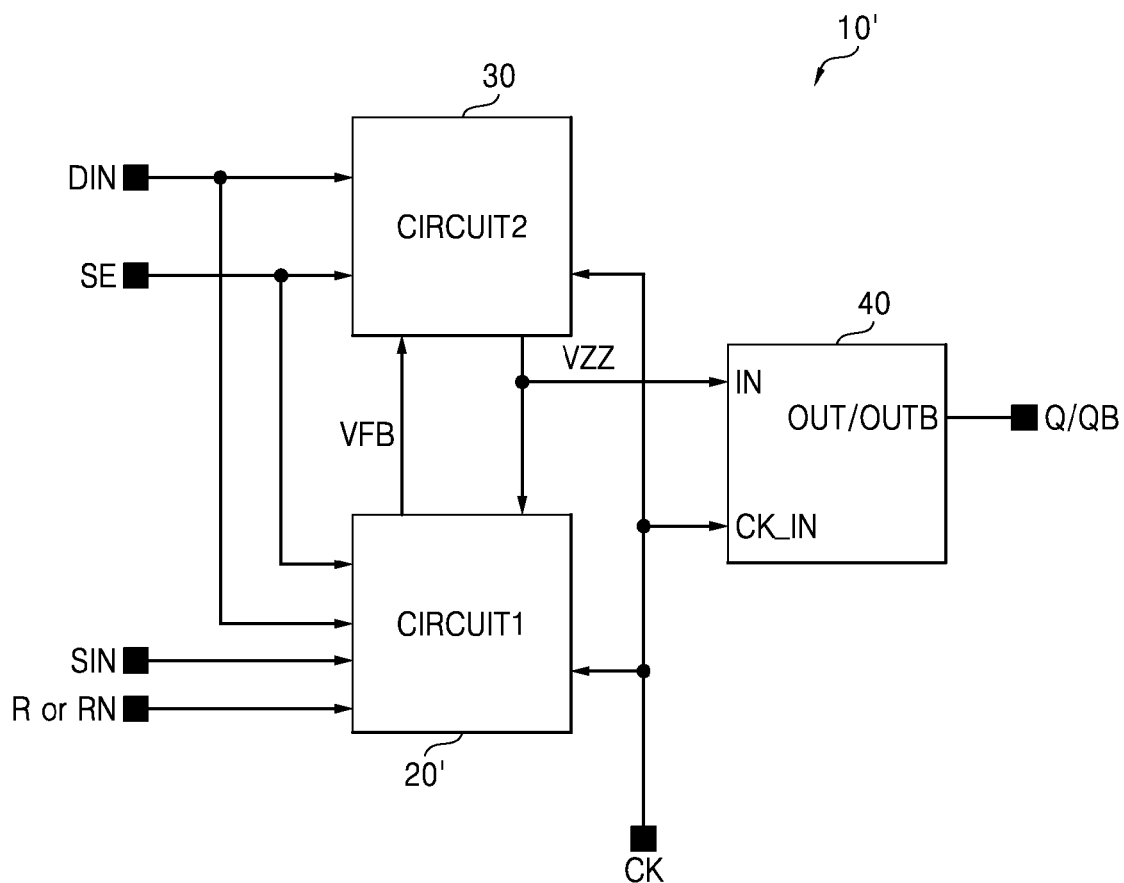
FIG. 26A is a schematic block diagram of the scan flip-flop according to another exemplary embodiment.

FIG. 26A is a schematic block diagram of the scan flip-flop according to another exemplary embodiment of the inventive concepts. Referring to FIG. 26A, a scan flip-flop 10' which may perform a reset function may include a first circuit 20', a second circuit 30 and a latch 40.

The scan flip-flop 10' may perform a normal operation or a scan operation according to a level of the scan enable signal SE. The scan flip-flop 10' may also perform the reset operation based on an indication signal R or RN indicating a reset operation.

For example, the scan flip-flop 10' may perform a normal operation or a scan operation in response to a reset signal R having L-level. However, the scan flip-flop 10' may perform a reset operation in response to a reset signal R having H-level.

During the reset operation, a voltage of the intermediate node is at L-level, so that a transistor P1 is turned on. Accordingly, the data VZZ becomes at H-level, and the latch 40 may output an output data Q having L-level through an output terminal OUT in response to a rising edge of the clock signal CK. According to an exemplary embodiment, the latch 40 may output an inverted output data QB having H-level through an inverted output terminal OUTB in response to a rising edge of the clock signal CK.

The reset signal R or an inverted reset signal RN supplied to the first circuit 20' may perform a function of an indication signal indicating a reset operation of the scan flip-flop 10'.

Figure 26B:
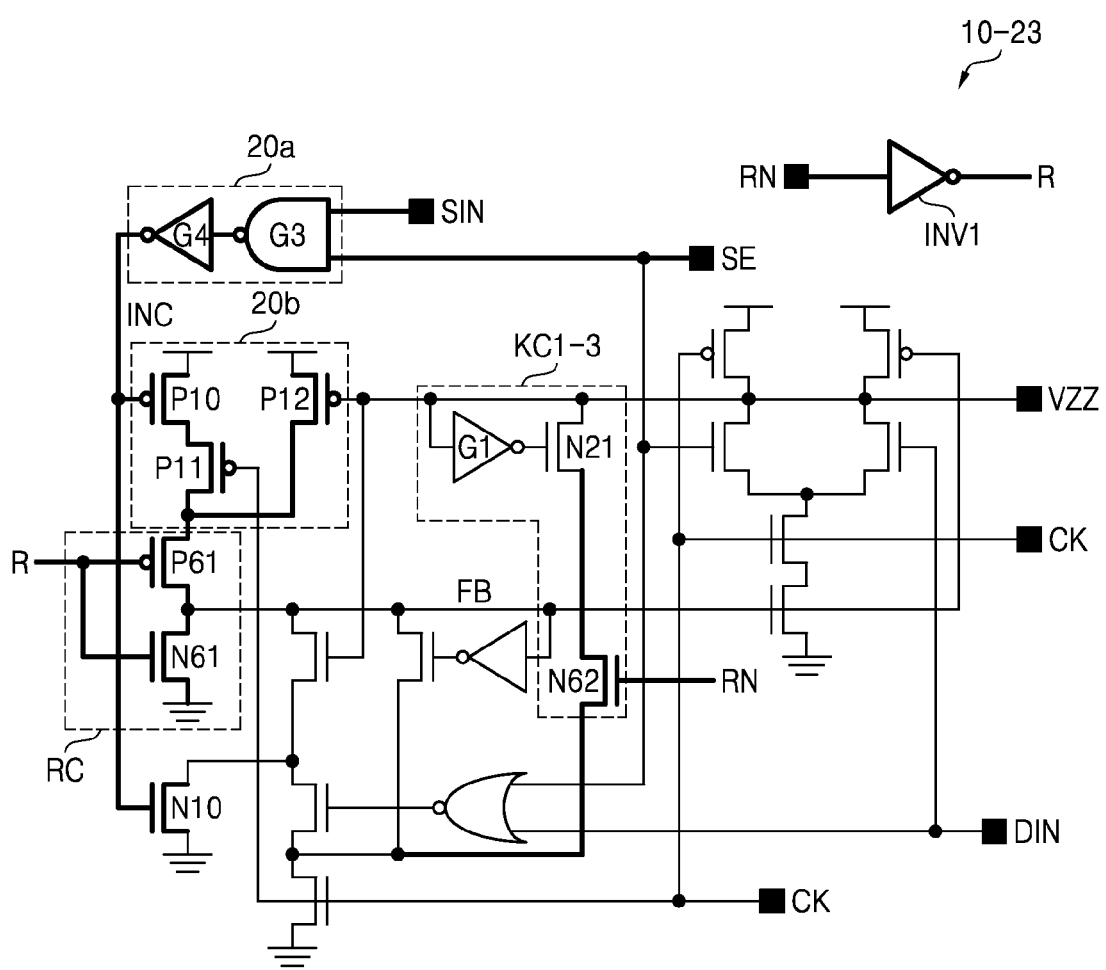

FIG. 26B is a circuit diagram depicting an exemplary embodiment of the scan flip-flop illustrated in FIG. 26A. Referring to FIGS. 2 and 26B, except for a reset circuit RC and a first keeper circuit KC1-3, a structure of the scan flip-flop 10-1 of FIG. 2 is substantially the same as a structure of a scan flip-flop 10-23 of FIG. 26B.

A reset circuit RC includes a transistor P61 connected between the first sourcing circuit 20b and the intermediate node FB, and a transistor N61 connected between the intermediate node FB and the ground node. A reset signal R is supplied to a gate of each transistor P61 and N61.

The first keeper circuit KC1-3 includes a transistor N62 connected between a common node of transistors N12 and N13 and a transistor N21. An inverted reset signal RN is supplied to a gate of a transistor N62. For example, when an inverted reset signal RN having H-level is input to the first circuit 20', an inverter INV1 outputs a reset signal R having L-level. Accordingly, each transistor P61 and N62 is turned on, so that a structure of the scan flip-flop 10-23 of FIG. 26B becomes substantially equal to a structure of the scan flip-flop 10-1 of FIG. 2.

On the contrary, when an inverted reset signal RN having L-level is input to the first circuit 20', the inverter INV1 outputs a reset signal R having H-level. Accordingly, a transistor N61 is turned on, so that a voltage of the intermediate node FB transits to L-level and the data VZZ of the latch input node ZZ transits to H-level.

Figure 27:
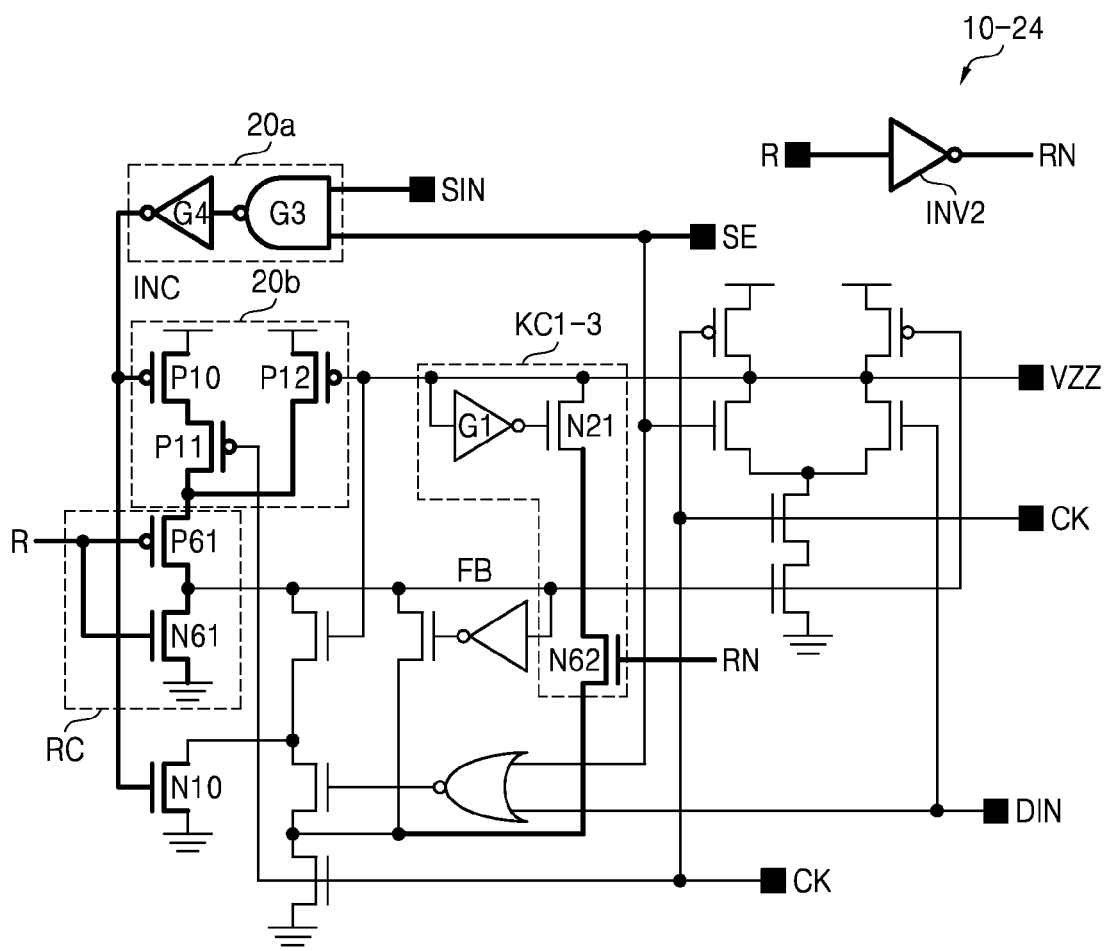

FIG. 27 is a circuit diagram depicting another exemplary embodiment of the scan flip-flop illustrated in FIG. 26A. While an inverted reset signal RN is input to the first circuit 20' in FIG. 26B, a reset signal R is input to the first circuit 20' in FIG. 27. An operation of the scan flip-flop 10-23 of FIG. 26B is substantially the same as an operation of a scan flip-flop 10-24 of FIG. 27.

Figure 28:
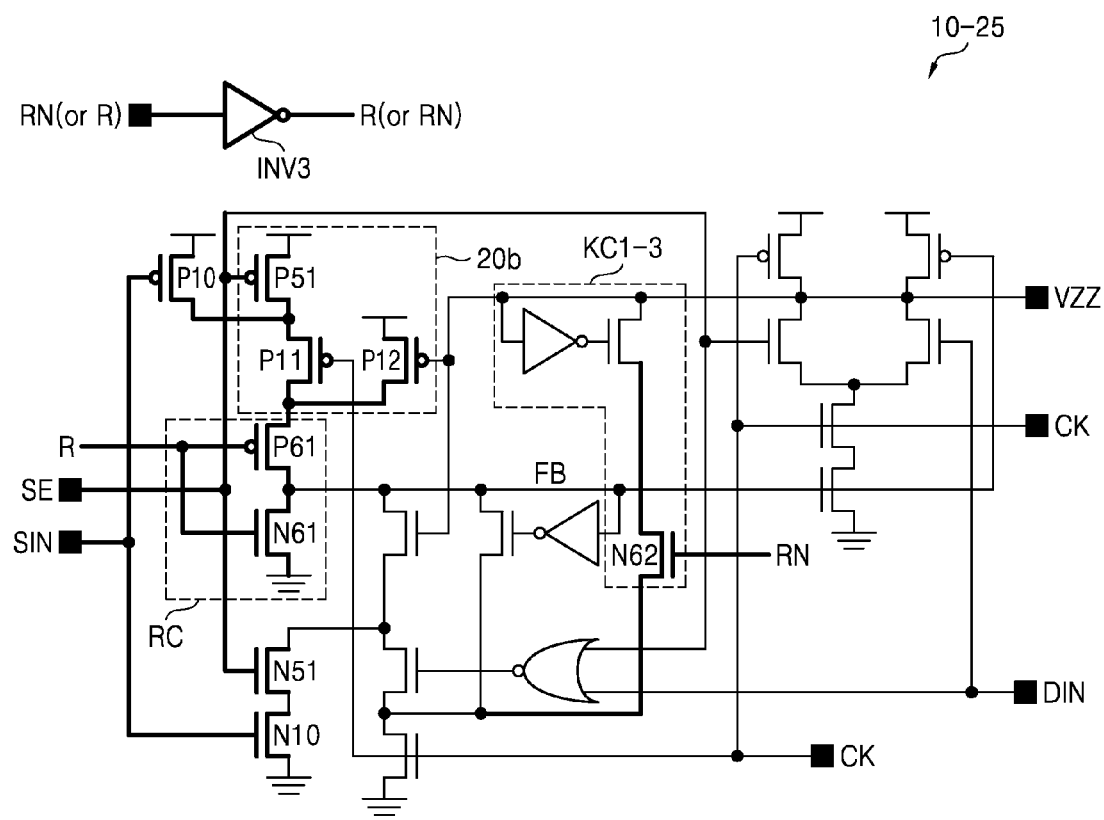

FIG. 28 is a circuit diagram depicting still another exemplary embodiment of the scan flip-flop illustrated in FIG. 26A. Referring to FIGS. 25 and 28, except for a reset circuit RC, a first keeper circuit KC1-3 and an inverter INV3, a structure and an operation of the scan flip-flop 10-22 of FIG. 25 is substantially the same as a structure and an operation of a scan flip-flop 10-25 of FIG. 28.

FIG. 29 is a circuit diagram depicting still another exemplary embodiment of the scan flip-flop illustrated in FIG. 1. Referring to FIGS. 2 and 29, except for a sourcing circuit 30b-6 and a second logic circuit G0', a structure and an operation of the scan flip-flop 10-1 of FIG. 2 is substantially the same as a structure and an operation of a scan flip-flop 10-26 of FIG. 29.

A sourcing circuit 30b-6 includes transistors N1, NB and NC receiving a data input DIN. Transistors N1, NB and NC connected in parallel perform a function of an OR gate. Here, a transistor N1 is gated according to a first bit A of the data input DIN, a transistor NB is gated according to a second bit B of the data input DIN, and a transistor NC is gated according to a third bit C of the data input DIN. In addition, the second logic circuit G0' performs a NOR operation on a scan enable signal SE and each bit A, B and C.

FIG. 30 is a circuit diagram depicting still another exemplary embodiment of the scan flip-flop illustrated in FIG. 1. Referring to FIGS. 2 and 30, except for a sourcing circuit 30b-7, the second logic circuit G0' and a third logic circuit G5, a structure and an operation of the scan flip-flop 10-1 of FIG. 2 is substantially the same as a structure and an operation of a scan flip-flop 10-27 of FIG. 30.

The sourcing circuit 30b-7 includes transistors N1 and NB' receiving the data input DIN. Transistors N1 and NB' connected in series perform a function of an AND gate. Here, the transistor N1 is gated according to a first bit A of the data input DIN, and the transistor NB' is gated according to a second bit B of the data input DIN.

A third logic circuit G5 performs an AND operation on each bit A and B. The second logic circuit G0 performs a NOR operation on a scan enable signal SE and an output signal of the third logic circuit G5.

Figure 31:
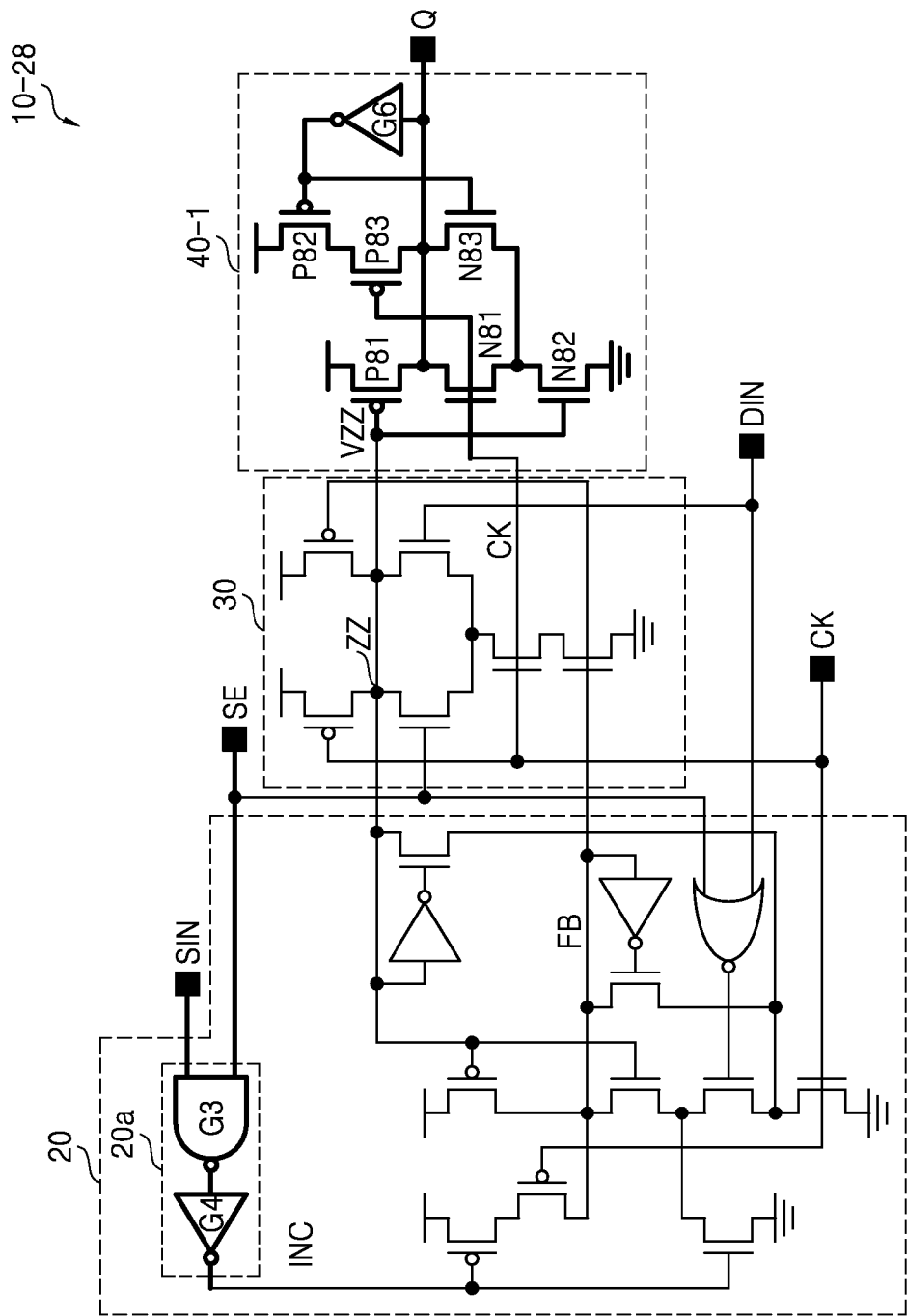

FIG. 31 is a circuit diagram depicting still another exemplary embodiment of the scan flip-flop illustrated in FIG. 1. Referring to FIGS. 2 and 31, a latch 40-1 according to an exemplary embodiment of the latch 40 of FIG. 2 includes transistors P81, P82, P83, N81, N82 and N83 and an inverter G6. PMOS transistors P81, P82 and P83 perform a function of a sourcing circuit or a pull-up circuit. NMOS transistors N81, N82 and N83 perform a function of a sinking circuit or a pull-down circuit.

For example, referring to a time point T3 of FIG. 4, a time point T6 of FIG. 4, a time point Tc of FIG. 6 or a time point Tf of FIG. 6, when the data VZZ is at L-level at a rising edge of the clock signal CK, each transistor P81, P82 and N81 is turned on and each transistor N82, N83 and P83 is turned off. Accordingly, the latch 40-1 outputs an output data Q having H-level.

In addition, referring to a time point T9 of FIG. 4 or a time point Tj of FIG. 6, when the data VZZ are at H-level at a rising edge of the clock signal CK, each transistor P81, P82 and P83 is turned off and each transistor N81, N82 and N83 is turned on. Accordingly, the latch 40-1 outputs an output data Q having L-level.

Figure 32:
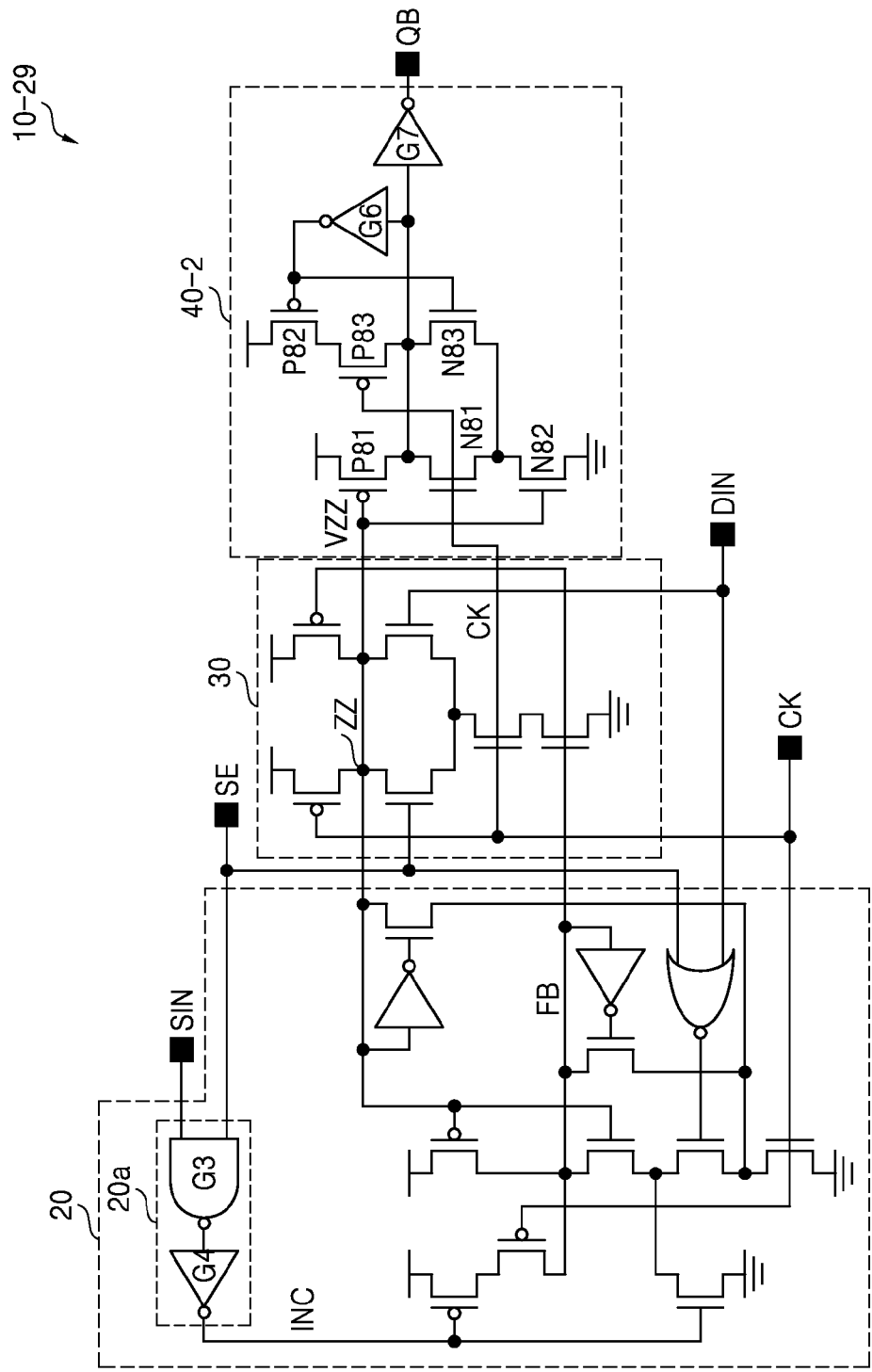

FIG. 32 is a circuit diagram depicting still another exemplary embodiment of the scan flip-flop illustrated in FIG. 1. Referring to FIGS. 31 and 32, except for an inverter G7, a structure and an operation of a latch 40-2 of FIG. 32 is substantially the same as a structure and an operation of the latch 40-1 of FIG. 31. That is, the inverter G7 outputs an inverted output data QB having a phase contrary to a phase of an output data.

Figure 33:
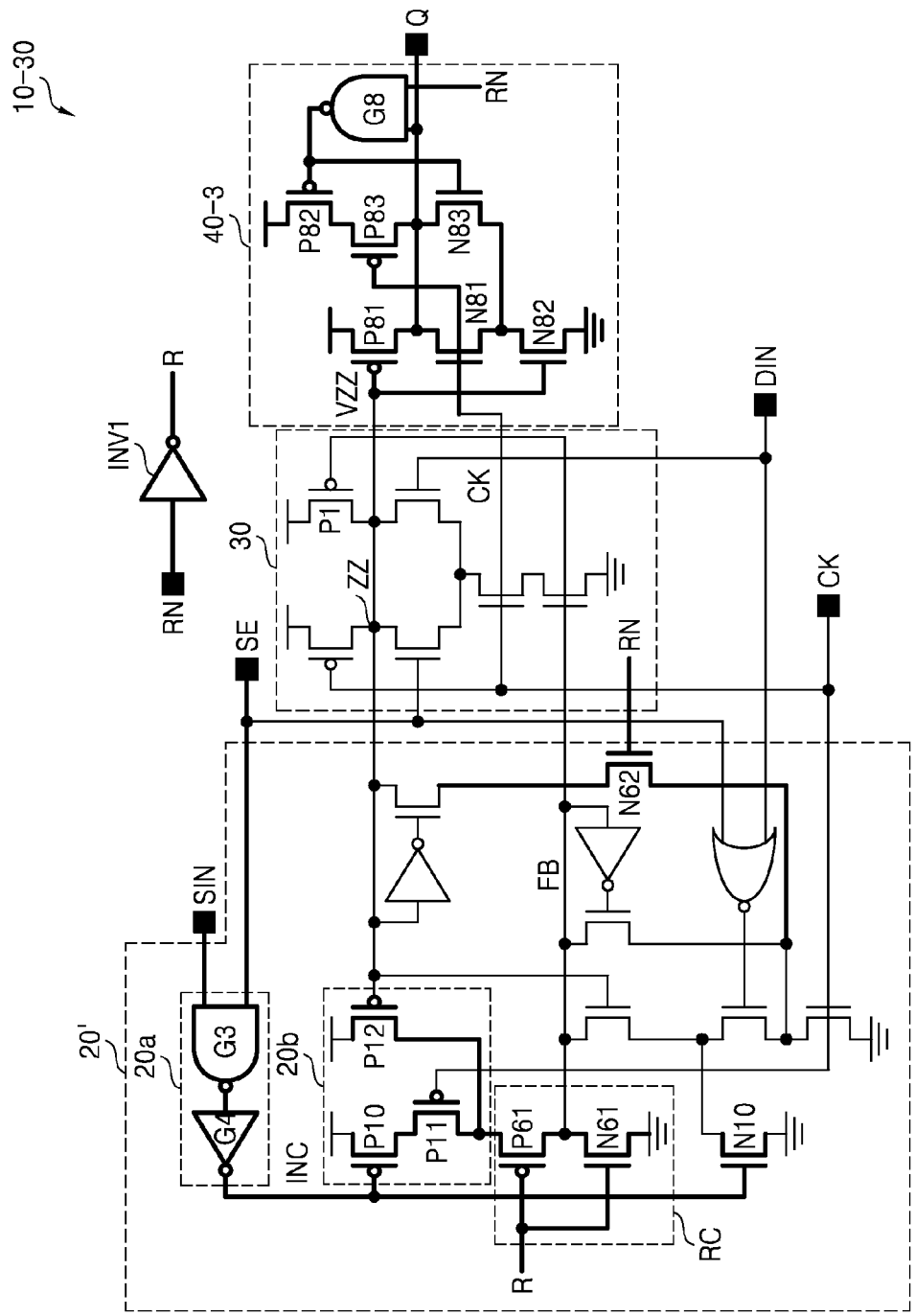
FIG. 33 is a circuit diagram depicting still another exemplary embodiment of the scan flip-flop illustrated in FIG. 26A.

FIG. 33 is a circuit diagram depicting still another exemplary embodiment of the scan flip-flop illustrated in FIG. 26A. Referring to FIGS. 26B and 33, except for a latch 40-3, the scan flip-flop 10-23 of FIG. 26B is substantially the same as a scan flip-flop 10-30 of FIG. 33.

In addition, except for that the inverter G6 of the latch 40-1 of FIG. 31 is changed to a NAND gate G8 of the latch 40-3 of FIG. 33, a structure of the latch 40-1 of FIG. 31 is substantially the same as a structure of the latch 40-3 of FIG. 33.

Since the intermediate node FB is pulled down to a ground and the transistor P1 is turned on by the reset circuit RC when the reset signal R is at H-level, i.e., when the scan flip-flop 10-30 is reset, the data VZZ has H-level. Since the inverted reset signal RN is at L-level, the NAND gate G8 outputs a signal having H-level. Accordingly, a transistor N82 is turned on in response to the data VZZ having the H-level, and a transistor N83 is turned on in response to an output signal of the NAND gate G8 having the H-level. Accordingly, an output signal Q transits to an initial state, e.g., L-level, regardless of a level of the clock signal CK.

Each latch 40-1, 40-2 or 40-3 is an exemplary embodiment of the latch 40 of FIG. 1 or the latch 40 of FIG. 26A.

Figure 34:
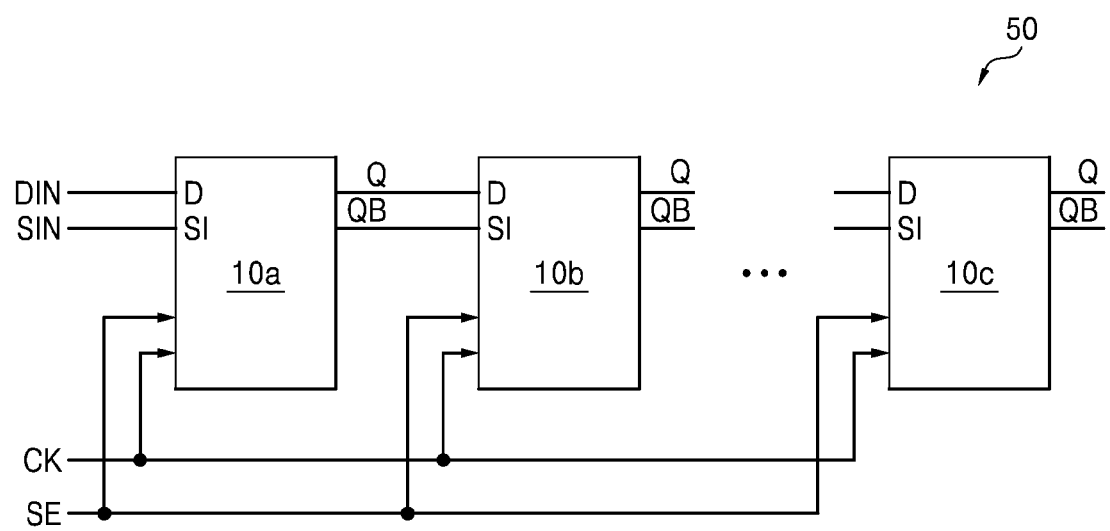
FIGS. 34 to 38 are block diagrams depicting exemplary embodiments of a data processing device including the scan flip-flop illustrated in FIG. 1 or 26A.

FIG. 34 is a block diagram depicting an exemplary embodiment of a data processing device including the scan flip-flop illustrated in FIG. 1 or 26A.

A data processing device 50 illustrated in FIG. 34 includes a plurality of scan flip-flops 10a, 10b, . . . , 10c. Each of the plurality of scan flip-flops 10a, 10b, . . . , 10c may be embodied in the scan flip-flop 10 of FIG. 1. In addition, each of the plurality of scan flip-flops 10a, 10b, . . . , 10c illustrated in FIG. 34 may be replaced with the scan flip-flop 10' including a reset function illustrated in FIG. 26A.

A first scan flip-flop 10a includes a first terminal D receiving a data input DIN and a second terminal SI receiving a scan data SIN. Additionally, each scan flip-flop 10b, . . . , 10c includes a terminal D receiving an output data Q and a terminal SI receiving an inverted output data QB.

For convenience of explanation, FIG. 34 illustrates an exemplary embodiment where the output data Q is input to the terminal D and the inverted output data QB is input to the terminal SI directly; however, the output data Q may be input to the terminal SI and the inverted output data QB may be directly input to the terminal D according to an exemplary embodiment.

Moreover, the output data Q may be input to one of the terminal D and the terminal SI after being processed by a first logic network (not shown) according to an exemplary embodiment, and the inverted output data QB may be input to the other of the terminal D and the terminal SI after being processed by a second logic network (not shown). The first logic network and the second logic network may be the same logic networks or different logic networks.

Here, a logic network may mean a combinational logic circuit.

The data processing device 50 may be embodied in an integrated circuit (IC), a system on chip (SoC), a central processing unit (CPU) or a processor.

Figure 35:
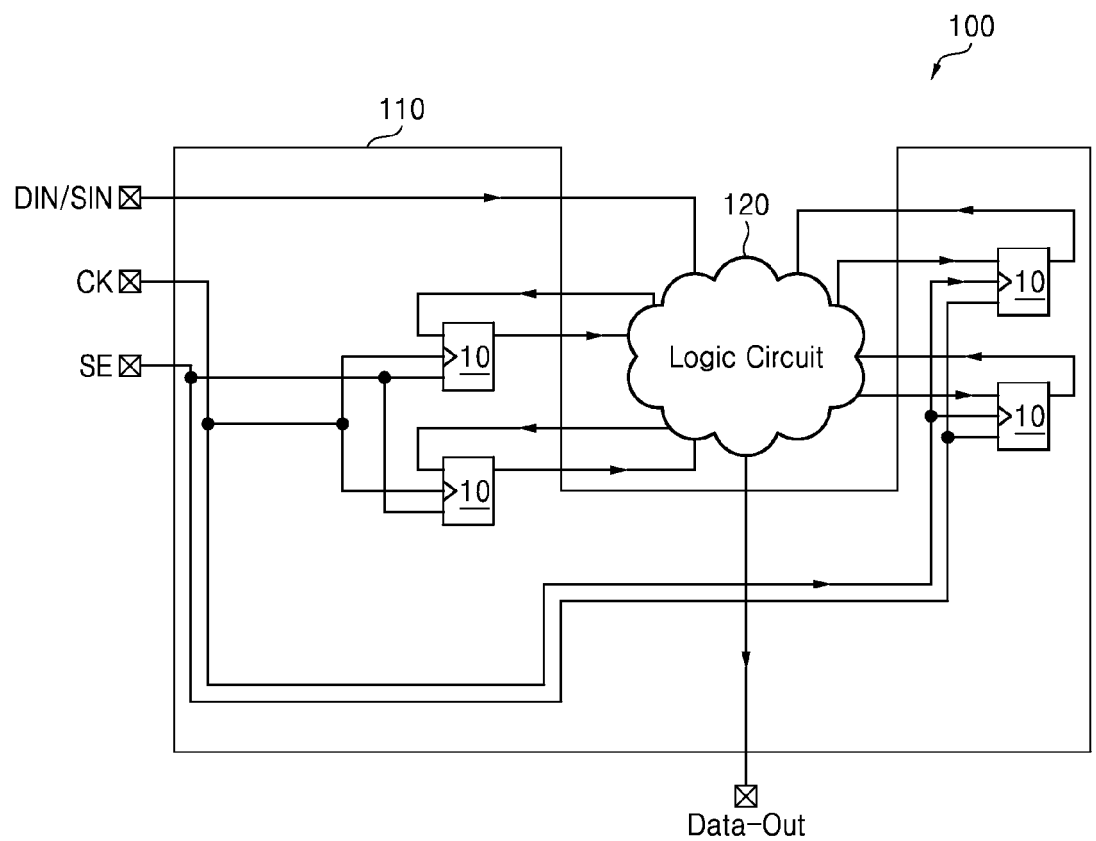

FIG. 35 is a block diagram depicting another exemplary embodiment of the data processing device including the scan flip-flop illustrated in FIG. 1 or 26A. A data processing device 100 may be embodied in an IC or a SoC including a plurality of scan flip-flops 10. As described above, the scan flip-flop 10 may be replaced with a san flip-flop 10' having a reset function.

Each of the plurality of scan flip-flops 10 may perform a data communication with a logic circuit 120 according to a clock signal CK. According to an exemplary embodiment, the logic circuit 120 may be embodied in a synchronous circuit or an asynchronous circuit. The logic circuit 120 may process a data input DIN or a scan data SIN, and output an output data Data-Out corresponding to a process result.

Figure 36:
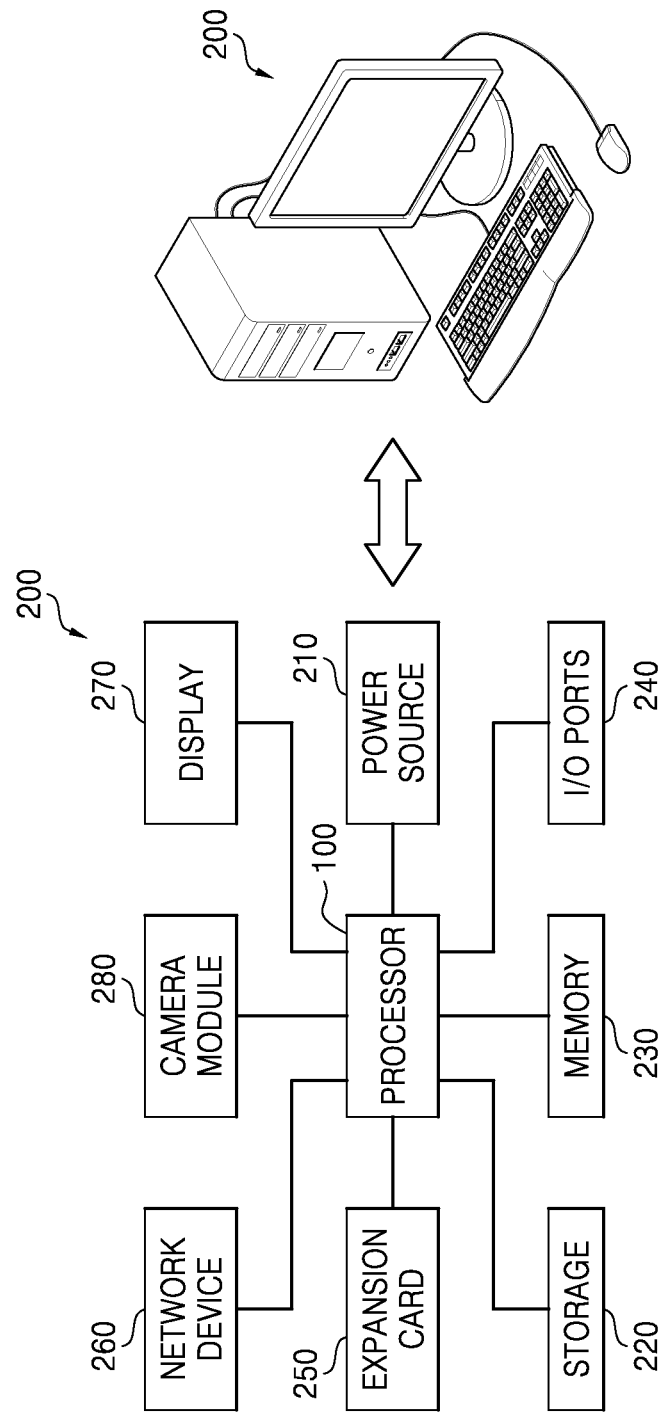

FIG. 36 is a block diagram depicting still another exemplary embodiment of the data processing device including the scan flip-flop illustrated in FIG. 1 or 26A.

Referring to FIG. 36, a data processing device 200 may be embodied in a personal computer (PC) or a data server.

The data processing device 200 includes a processor 100, a power source 210, a storage device 220, a memory 230, input/output ports 240, an expansion card 250, a network device 260 and a display 270. According to an exemplary embodiment, the data processing device 200 may further include a camera module 280.

The processor 100 means the data processing device illustrated in FIG. 35, which is embodied in an IC or an SoC. The processor 100 may be a multi-core processor. The processor 100 may control at least one of elements 100 and 210 to 280.

The power source 210 may supply an operation voltage to at least one of the elements 100 and 210 to 280. The storage device 220 may be embodied in a hard disk drive (HDD) or a solid state drive (SSD).

The memory 230 may be embodied in a volatile memory or a non-volatile memory. According to an exemplary embodiment, a memory controller which may control a data access operation on the memory 230, e.g., a read operation, a write operation (or a program operation) or an erase operation, may be integrated or embedded in the processor 100. According to another exemplary embodiment, the memory controller may be embodied between the processor 100 and the memory 230.

The input/output ports 240 mean ports which may transmit data to the data storage device 200 or transmit data output from the data storage device 200 to an external device. For example, the input/output ports 240 may be a port for connecting a pointing device like a computer mouse, a port for connecting a printer, or a port for connecting a USB drive.

The expansion card 250 may be embodied in a secure digital (SD) card or a multi-media card (MMC). According to an exemplary embodiment, the expansion card 250 may be a subscriber identification module (SIM) card or a universal subscriber identity module (USIM) card.

The network device 260 means a device which may connect the data storage device 200 with a wire network or a wireless network.

The display 270 may display data output from the storage device 220, the memory 230, the input/output ports 240, the expansion card 250 or the network device 260.

The camera module 280 means a module which may convert an optical image into an electrical image. Accordingly, an electrical image output from the camera module 280 may be stored in the storage device 220, the memory 230 or the expansion card 250. Additionally, an electrical image output from the camera module 280 may be displayed through the display 220.

Figure 37:
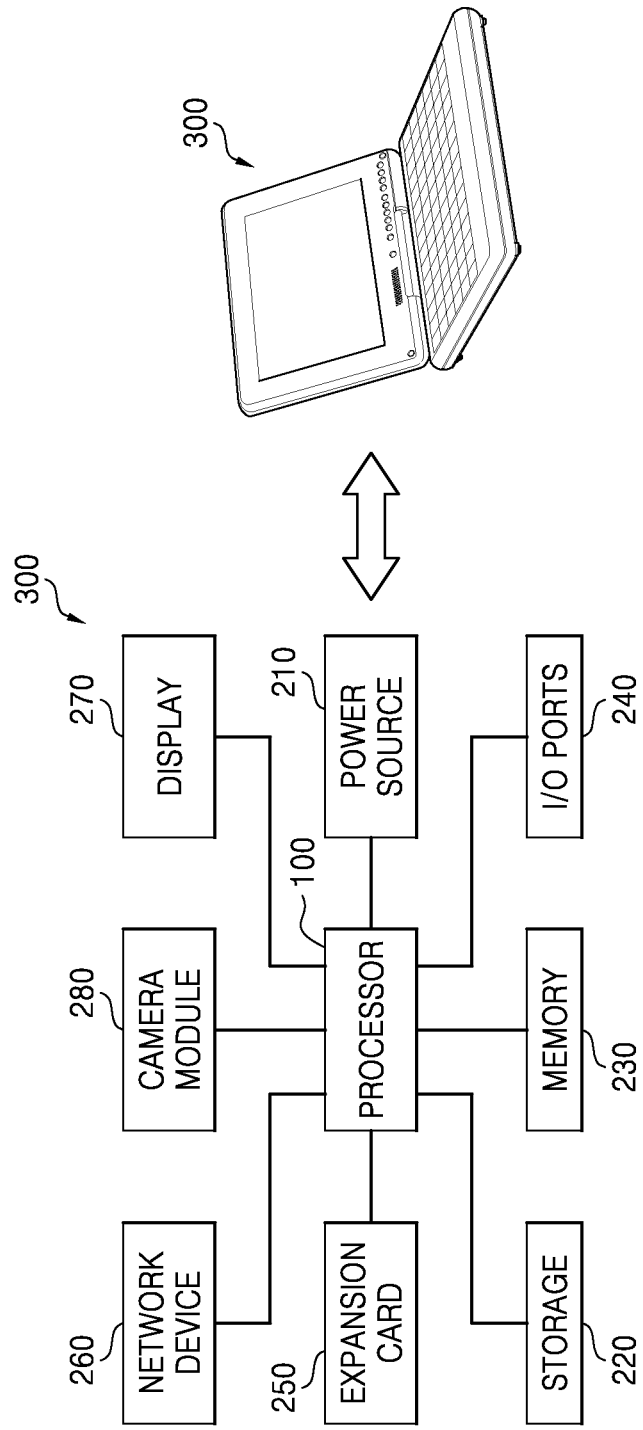

FIG. 37 is a block diagram depicting still another exemplary embodiment of the data processing device including the scan flip-flop illustrated in FIG. 1 or 26A. Referring to FIG. 37, a data processing device 300 may be embodied in a laptop computer.

Figure 38:
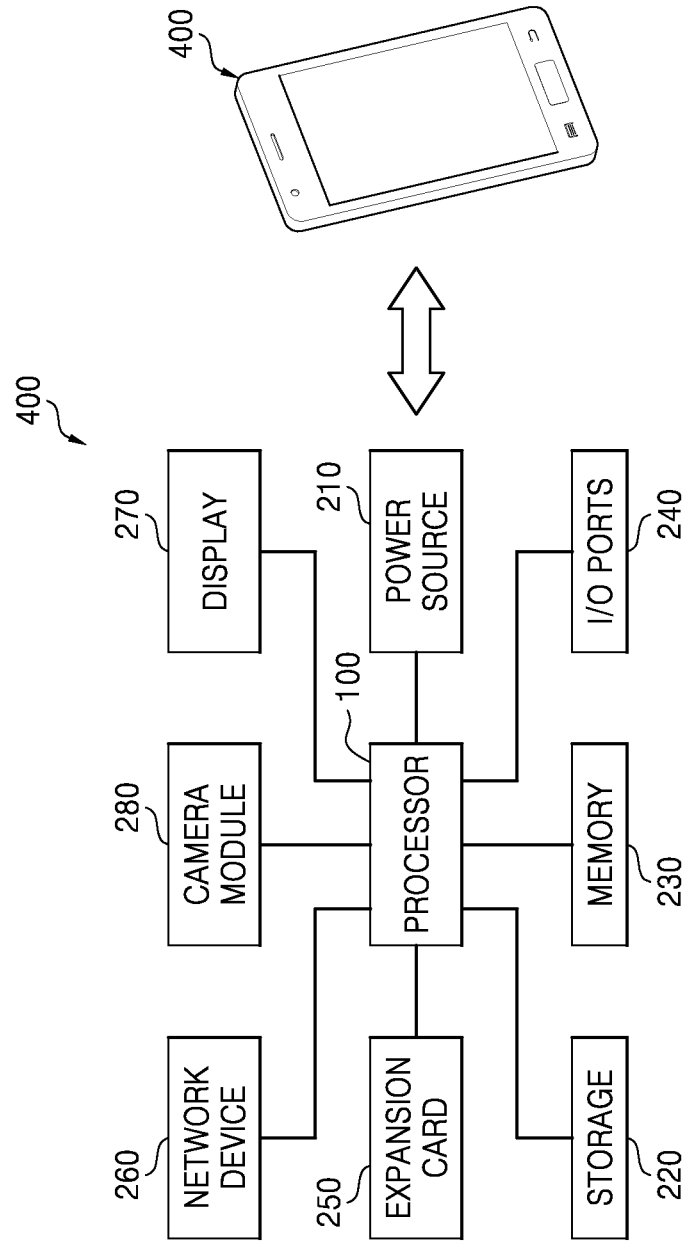

FIG. 38 is a block diagram depicting still another exemplary embodiment of the data processing device including the scan flip-flop illustrated in FIG. 1 or 26A.

A data processing device 400 may be embodied in a portable device. The portable device 400 may be embodied in a cellular phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, or an e-book.

Figure 39:
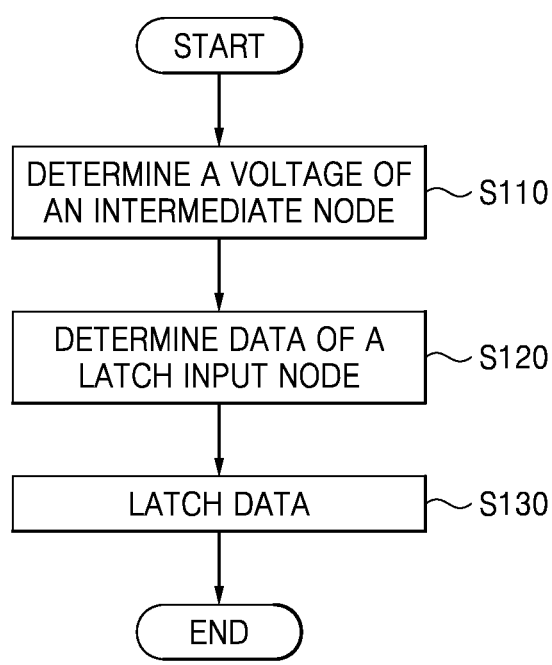
FIG. 39 is a flowchart for explaining a scan operation of the scan flip-flop illustrated in FIG. 1 or 26A according to an exemplary embodiment.

FIG. 39 is a flowchart for explaining the scan operation of the scan flip-flop illustrated in FIG. 1. An operating method of the scan flip-flop 10 or 10' which performs the normal operation latching the data input DIN and the scan operation latching the scan input INC related to the scan data SIN is explained in detail referring to FIGS. 1 to 39.

When the scan flip-flop 10 or 10' performs the scan operation, the intermediate node voltage VFB of the intermediate node FB is determined based on the clock signal CK, the scan input INC (or the scan data SIN) and the data VZZ of the latch input node ZZ (S110).

Referring to the time point Td or Tk of FIG. 6, when the clock signal CK is at H-level, the intermediate node voltage VFB retains the intermediate voltage VFB which is immediately before the clock signal CK transits to H-level at Td or Tk, respectively. Referring to the time point Te of FIG. 6 or the time point Tl of FIG. 6, when the clock signal CK is at L-level, the intermediate node voltage VFB is determined by a voltage synchronized with the scan input INC or the scan data SIN.

The Data VZZ is determined based on the clock signal CK and the intermediate node voltage VFB (S120). The supply voltage Vdd is sourced to the latch input node ZZ based on the clock signal CK and the intermediate node voltage VFB. Accordingly, the data VZZ is determined.

During the normal operation, the voltage of the latch input node ZZ is sunk to the ground based on the clock signal CK, the intermediate node voltage VFB and the data input DIN. In addition, the voltage of the latch input node ZZ is sunk to the ground based on the clock signal CK and the intermediate node voltage VFB during the scan operation. Accordingly, the data VZZ is determined to be at L-level or H-level according to an operation of the second circuit 30. The latch 40 latches the data VZZ based on the clock signal CK (S130).

A scan flip-flop according to an exemplary embodiment of the inventive concepts may operate with high speed and low power.

Although a few exemplary embodiments of the inventive concept have been shown and described, it will be appreciated by those skilled in the art that changes may be made in these embodiments without departing from the principles and spirit of the inventive concept, the scope of which is defined in the appended claims and their equivalents.

What is claimed is:

1. A scan flip-flop which performs a normal operation latching a data input, which is externally input to the scan flip-flop via a first terminal, and a scan operation latching a scan input, which is externally input to the scan flip-flop via a second terminal, the scan flip-flop comprising:
- a first circuit determining an intermediate node voltage, which is a voltage at an intermediate node, based on a clock signal, one of the data input and the scan input, and data of a latch input node;
- a second circuit determining the data based on the clock signal, the intermediate node voltage and the data input during the normal operation and determining the data based on the clock signal and the intermediate node voltage during the scan operation; and
- a latch latching the data based on the clock signal and outputting the latched data via an output terminal,
- wherein the first circuit includes a first sourcing circuit including:
  - a first sub-sourcing circuit controlling connection between a power node and the intermediate node in response to the clock signal and the scan input; and
  - a second sub-sourcing circuit controlling connection between the power node and the intermediate node in response to the data.

2. The scan flip-flop of claim 1, wherein, when the scan flip-flop performs the scan operation, the first circuit keeps an intermediate node voltage at a first phase of the clock signal to an intermediate node voltage when the clock signal transits, and determines an intermediate node voltage at a second phase of the clock signal to be synchronized with the scan input, and
- wherein the first phase and the second phase have opposite signal levels.

3. The scan flip-flop of claim 1, wherein an overlap section between the clock signal and the intermediate node voltage corresponds to a half cycle of the clock signal.

4. The scan flip-flop of claim 1, wherein the second circuit includes:
- a second sourcing circuit sourcing a supply voltage to the latch input node based on the clock signal and the intermediate node voltage; and
- a sinking circuit sinking a voltage of the latch input node to a ground based on the clock signal, the intermediate node voltage and the data input during the normal operation, and sinking the voltage of the latch input node to the ground based on the clock signal and the intermediate node voltage during the scan operation.

5. The scan flip-flop of claim 4, wherein the second sourcing circuit includes:
- a third sub-sourcing circuit sourcing the supply voltage to the latch input node in response to the clock signal; and
- a fourth sub-sourcing circuit sourcing the supply voltage to the latch input node in response to the intermediate node voltage.

6. The scan flip-flop of claim 1, wherein the first circuit further includes:
- a first connection circuit controlling connection between the intermediate node and a ground node based on the scan input and the data; and
- a second connection circuit controlling connection between the intermediate node and the ground node based on a logical combination signal of a scan enable signal and the data input, the data, and the clock signal.

7. The scan flip-flop of claim 6, wherein the first circuit further includes:
- a first keeper circuit discharging the data through the second connection circuit; and
- a second keeper circuit discharging the intermediate node voltage through the second connection circuit.

8. The scan flip-flop of claim 6, wherein the first circuit further includes:
- a first keeper circuit discharging the data through the second circuit; and
- a second keeper circuit discharging the intermediate node voltage through the second connection circuit.

9. The scan flip-flop of claim 1, wherein the first circuit further includes:
- a first connection circuit controlling connection between the intermediate node and a ground node in response to the scan input and the data; and
- a second connection circuit controlling connection between the first connection circuit and the ground node in response to a logical combination signal of a scan enable signal and the data input and the clock signal.

10. The scan flip-flop of claim 9, wherein the first circuit further includes:
- a first keeper circuit discharging the data through the second connection circuit; and
- a second keeper circuit discharging the intermediate node voltage through the second connection circuit.

11. The scan flip-flop of claim 1, wherein the first circuit further includes:
- a first connection circuit controlling connection between the intermediate node and a ground node in response to the scan input and the data; and
- a second connection circuit controlling connection between the intermediate node and the first connection circuit in response to a logical combination signal of a scan enable signal and the data input and the clock signal.

12. The scan flip-flop of claim 11, wherein the first circuit further includes:
- a first keeper circuit discharging the data through the second circuit; and
- a second keeper circuit discharging the intermediate node voltage through at least one of the first connection circuit and the second connection circuit.

13. The scan flip-flop of claim 1, wherein the data input comprises one-bit or more.

14. The scan flip-flop of claim 1, wherein the first circuit further includes:
- a first keeper circuit for discharging the data based on the clock signal and the data; and
- a second keeper circuit for discharging the intermediate node voltage based on the clock signal and the intermediate node voltage.

15. The scan flip-flop of claim 1, wherein the first circuit further includes a keeper circuit for discharging the data through the second circuit based on the clock signal, the data and the intermediate node voltage.

16. The scan flip-flop of claim 1, wherein the first circuit includes a reset circuit pulling down the intermediate node voltage to a ground in response to an indication signal indicating a reset operation.

17. The scan flip-flop of claim 16, wherein, when the scan flip-flop performs the scan operation, the first circuit keeps an intermediate node voltage at a first phase of the clock signal to an intermediate node voltage when the clock signal transits, and determines an intermediate node voltage at a second phase of the clock signal to be synchronized with the scan input,
- wherein the first phase and the second phase have different signal levels.

18. A data processing device comprising:
the scan flip-flop of claim 8; and a logic circuit outputting at least one of scan data related to the scan input and the data input to the scan flip-flop.

19. The data processing device of claim 18, wherein the first circuit includes a reset circuit pulling down the intermediate node voltage to a ground in response to an indication signal indicating a reset operation.

20. A method of operating a scan flip-flop which performs a normal operation latching a data input, which is externally input to the scan flip-flop via a first terminal, and a scan operation latching a scan input, which is externally input to the scan flip-flop via a second terminal, the method comprising:
   determining an intermediate node voltage, which is a voltage at an intermediate node of the scan flip-flop, based on a clock signal, the scan input and data of a latch input node when the scan flip-flop performs the scan operation;
   determining the data based on the clock signal and the intermediate node voltage; and
   latching the data based on the clock signal and outputting the latched data via an output terminal,
   wherein the determining the intermediate node voltage includes:
      controlling connection between a power node and the intermediate node in response to the clock signal and the scan input; and
      controlling connection between the power node and the intermediate node in response to the data.

21. The method of claim 20, wherein the determining the intermediate node voltage further includes:
   keeping an intermediate node voltage at a first phase of the clock signal to an intermediate node voltage when the clock signal transits, and
   determining an intermediate node voltage at a second phase of the clock signal to be synchronized with the scan input,
   wherein the first phase and the second phase have opposite signal levels.

22. The method of claim 21, wherein the determining the intermediate node voltage further includes:
   keeping an intermediate node voltage at a first phase of the clock signal to an intermediate node voltage at a time immediately before the clock signal transits, and
   determining an intermediate node at a second phase of the clock signal to be synchronized with the scan input,
   wherein the first phase and the second phase have opposite signal levels.

23. The method of claim 21, wherein, when the intermediate node voltage at the first phase of the clock signal is kept to the intermediate node voltage when the clock signal transits, the scan input has a signal level which is opposite to a signal level of the first phase.

24. The method of claim 20, wherein the determining the intermediate node voltage further includes:
   keeping an intermediate node voltage at a first phase of the clock signal to an intermediate node voltage at a time immediately before the clock signal transits, and
   determining an intermediate node at a second phase of the clock signal to be synchronized with the scan input,
   wherein the first phase and the second phase have opposite signal levels.

25. The method of claim 20, wherein the determining the intermediate node voltage further includes:
   not synchronizing an intermediate node voltage at a first phase of the clock signal with the scan input; and
   synchronizing an intermediate node voltage at a second phase of the clock signal with the scan input,
   wherein the first phase and the second phase have opposite signal levels.

26. The method of claim 20, wherein an overlap section between the clock signal and the intermediate node voltage corresponds to a half cycle of the clock signal.

27. The method of claim 20, wherein the determining the data includes:
   sourcing a supply voltage to the latch input node based on the clock signal and the intermediate node voltage; and
   sinking a voltage of the latch input node to a ground based on the clock signal, the intermediate node voltage and the data input during the normal operation, and sinking the voltage of the latch input node to the ground based on the clock signal and the intermediate node voltage during the scan operation.

28. A scan flip-flop circuitry connected to a latch for performing a normal operation latching a data input which is externally input to the scan flip-flop circuitry and a scan operation latching a scan input which is externally input to the scan flip-flop circuitry, the circuitry comprising;
   a first circuit determining an intermediate node signal at an intermediate node, based on a clock signal, one of the data input and the scan input, and a latch input signal at an input node of the latch; and
   a second circuit determining the latch input signal based on the clock signal, the intermediate node signal and the data input during the normal operation and determining the latch input signal based on the clock signal and the intermediate node signal during the scan operation,
   wherein the intermediate node is a node disposed between the first circuit and the second circuit,
   wherein, when the scan flip-flop circuitry performs the scan operation, the first circuit keeps an intermediate node signal at a first phase of the clock signal until the clock signal transits, and determines an intermediate node signal at a second phase of the clock signal to be synchronized with the scan input, and
   wherein the first phase and the second phase have different signal levels, and wherein the first circuit includes a sourcing circuit including:
      a first sub-sourcing circuit controlling connection between a power node and the intermediate node in response to the clock signal and the scan input; and
      a second sub-sourcing circuit controlling connection between the power node and the intermediate node in response to the latch input signal.

* * * * *